US011754869B1

(12) United States Patent
Kang

(10) Patent No.: US 11,754,869 B1
(45) Date of Patent: Sep. 12, 2023

(54) ELECTRONIC DEVICE

(71) Applicant: Samsung Display Co., Ltd., Yongin-si (KR)

(72) Inventor: Dongjin Kang, Suwon-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 18/077,997

(22) Filed: Dec. 8, 2022

(30) Foreign Application Priority Data

Feb. 18, 2022 (KR) .................. 10-2022-0021623

(51) Int. Cl.
G02F 1/1333 (2006.01)
G02F 1/137 (2006.01)
G02F 1/1347 (2006.01)
G02F 1/1335 (2006.01)
H10K 59/38 (2023.01)
H10K 59/40 (2023.01)
H10K 59/50 (2023.01)
H10K 59/65 (2023.01)
H10K 59/122 (2023.01)
G06V 40/13 (2022.01)

(52) U.S. Cl.
CPC .......... G02F 1/13338 (2013.01); G02F 1/137 (2013.01); G02F 1/1347 (2013.01); G02F 1/133514 (2013.01); H10K 59/122 (2023.02); H10K 59/38 (2023.02); H10K 59/40 (2023.02); H10K 59/50 (2023.02); H10K 59/65 (2023.02); G06V 40/1318 (2022.01)

(58) Field of Classification Search
CPC ........... G02F 1/13338; G02F 1/133514; G02F 1/1347; G02F 1/137; H10K 59/122; H10K 59/38; H10K 59/40; H10K 59/50; H10K 59/65; G06V 40/1318
See application file for complete search history.

(56) References Cited

U.S. PATENT DOCUMENTS 8,970,501 B2 3/2015 Hotelling et al.
10,268,884 B2 4/2019 Jones et al.
10,491,726 B2 11/2019 Lee et al.
(Continued)

FOREIGN PATENT DOCUMENTS

CN 101632057 A 1/2010
CN 107068716 A 8/2017
(Continued)

OTHER PUBLICATIONS

Taisuke Kamada et al., OLED display Incorporating organic photodiodes for fingerprint Imaging. J Soc Inf Display, pp. 361-371, Mar. 21, 2019.

Primary Examiner — Anne M Hines
Assistant Examiner — Jose M Diaz
(74) Attorney, Agent, or Firm — Lewis Roca Rothgerber Christie LLP

(57) ABSTRACT

An electronic device includes a base layer, a circuit layer on the base layer, a display element layer on the circuit layer, the display element layer including a pixel defining film having an opening part, and a light emitting element and a light receiving element divided by the pixel defining film, an input detection layer on the display element layer and overlapping the light emitting element, and a liquid crystal member on the display element layer and overlapping the light receiving element.

20 Claims, 15 Drawing Sheets

(56) References Cited

U.S. PATENT DOCUMENTS

| | | | |
|---|---|---|---|
| 10,872,223 | B2 | 12/2020 | Ding et al. |
| 11,183,133 | B2 | 11/2021 | Lim |
| 11,233,100 | B2 | 1/2022 | Feng et al. |
| 2019/0012507 | A1* | 1/2019 | Dattalo ............... G06V 40/1318 |
| 2019/0122025 | A1* | 4/2019 | Gove ................. G06V 40/1382 |

FOREIGN PATENT DOCUMENTS

| | | |
|---|---|---|
| CN | 107122759 A | 9/2017 |
| CN | 107451576 A | 12/2017 |
| JP | 2000-152254 A | 5/2000 |
| KR | 10-2017-0037344 A | 4/2017 |
| KR | 10-2017-0103159 A | 9/2017 |
| KR | 10-1968803 B1 | 4/2019 |
| KR | 10-2019-0083176 A | 7/2019 |

\* cited by examiner

ELECTRONIC DEVICE

CROSS-REFERENCE TO RELATED APPLICATIONS

This application claims priority to and the benefit of Korean Patent Application No. 10-2022-0021623, filed on Feb. 18, 2022, the entire content of which is hereby incorporated by reference.

BACKGROUND

1. Field

Embodiments of the present disclosure relate to an electronic device including a light receiving element in an active area.

2. Description of the Related Art

Various types (kinds) of electronic devices are used to provide image information, and these electronic devices provide one or more suitable functions for organic or biometric communication with users, such as sensing a user's input. In particular, recent electronic devices include a function for detecting a user's fingerprint.

The fingerprint recognition method includes a capacitive method for detecting a change in capacitance formed between electrodes, an optical method for detecting incident light using an optical sensor, and an ultrasonic method for sensing vibration using a piezoelectric material. On the other hand, when an optical sensor is included, it is necessary to improve fingerprint recognition performance by blocking noise caused by external light and/or the like.

SUMMARY

Aspects of embodiments of the present disclosure are directed toward an electronic device with improved sensing sensitivity of a light receiving element.

Additional aspects will be set forth in part in the description which follows and, in part, will be apparent from the description, or may be learned by practice of the presented embodiments of the disclosure.

Embodiments of the present disclosure provide an electronic device including: a base layer; a circuit layer disposed on the base layer; display element layer disposed on the circuit layer, the display element layer including a pixel defining film having an opening part defined, and a light emitting element and a light receiving element divided by the pixel defining film; an input detection layer disposed on the display element layer and overlapping the light emitting element; and a liquid crystal member disposed on the display element layer and overlapping the light receiving element, wherein the liquid crystal member includes: a first liquid crystal electrode; second liquid crystal electrode disposed on the first liquid crystal electrode; and liquid crystal layer disposed between the first liquid crystal electrode and the second liquid crystal electrode, and including a plurality of liquid crystal molecules.

In an embodiment, when there is no voltage difference between the first liquid crystal electrode and the second liquid crystal electrode, the liquid crystal member may operate in a first mode in which the liquid crystal molecules are irregularly arranged; and when there is a voltage difference between the first liquid crystal electrode and the second liquid crystal electrode, the liquid crystal member may operate in a second mode in which the liquid crystal molecules are regularly arranged.

In an embodiment, in the second mode, a major axis direction of the liquid crystal molecules may be substantially parallel to a stacking direction of the first liquid crystal electrode and the second liquid crystal electrode.

In an embodiment, in the second mode, a major axis direction of the liquid crystal molecules may be a direction perpendicular to a direction in which the first liquid crystal electrode and the second liquid crystal electrode are stacked.

In an embodiment, the liquid crystal molecules may include first to fifth sub liquid crystal molecules respectively disposed on first to fifth planes substantially parallel to each other, wherein in the second mode, the first to fourth sub liquid crystal molecules may be aligned in different directions, and the fifth sub liquid crystal molecules may be aligned in substantially the same direction as the first sub liquid crystal molecules.

In an embodiment, the liquid crystal layer may further include a dispersion medium in which the liquid crystal molecules are dispersed, wherein the dispersion medium may include a polymer.

In an embodiment, the liquid crystal layer may include: a first sub liquid crystal layer disposed on the first liquid crystal electrode and including the liquid crystal molecules; and second sub liquid crystal layer disposed between the first sub liquid crystal layer and the second liquid crystal electrode and including the liquid crystal molecules, wherein when there is no voltage difference between the first liquid crystal electrode and the second liquid crystal electrode, each of the first sub liquid crystal layer and the second sub liquid crystal layer may operate in a first sub mode in which the liquid crystal molecules are irregularly arranged, and when there is a voltage difference between the first liquid crystal electrode and the second liquid crystal electrode, each of the first sub liquid crystal layer and the second sub liquid crystal layer may operate in a second sub mode in which the liquid crystal molecules are regularly arranged, wherein an alignment direction of the liquid crystal molecules included in the first sub liquid crystal layer in the second sub mode and an alignment direction of the liquid crystal molecules included in the second sub liquid crystal layer in the second sub mode may be different from each other.

In an embodiment, in the second sub mode, a major axis direction of the liquid crystal molecules included in the first sub liquid crystal layer may be substantially parallel to a direction in which the first liquid crystal electrode and the second liquid crystal electrode are stacked, wherein in the second sub mode, a major axis direction of the liquid crystal molecules included in the second sub liquid crystal layer may be perpendicular to a direction in which the first liquid crystal electrode and the second liquid crystal electrode are stacked.

In an embodiment, in the second sub mode, a major axis direction of the liquid crystal molecules included in the first sub liquid crystal layer may be perpendicular to a direction in which the first liquid crystal electrode and the second liquid crystal electrode are stacked, wherein in the second sub mode, a major axis direction of the liquid crystal molecules included in the second sub liquid crystal layer may be substantially parallel to a direction in which the first liquid crystal electrode and the second liquid crystal electrode are stacked.

In an embodiment, a polarization layer may not be included on the input detection layer.

In an embodiment, the electronic device may further include a color filter layer disposed between the light receiving element and the input detection layer.

In an embodiment, the color filter layer may transmit light in a wavelength region of about 750 nm or more and about 2500 nm or less or light in a wavelength region of about 500 nm or more and about 600 nm or less, wherein the light receiving element may detect light in a wavelength region of about 750 nm or more and about 2500 nm or less or light in a wavelength region of about 500 nm or more and about 600 nm or less.

In an embodiment of the present disclosure, an electronic device divided into first to third light emitting area, a non-light emitting area, and a light receiving area includes: a base layer; a circuit layer disposed on the base layer; a first electrode disposed on the circuit layer to correspond to the first to third light emitting areas and the light receiving area; a hole transport region disposed on the first electrode and disposed to correspond to the first to third light emitting areas, the non-light emitting area, and the light receiving area; a first light emitting layer disposed on the hole transport region to correspond to the first light emitting area and emitting a first light; a second light emitting layer disposed on the hole transport region to correspond to the second light emitting area and emitting a second light; a third light emitting layer disposed on the hole transport region to correspond to the third light emitting area and emitting a third light; a light receiving layer disposed on the hole transport region to correspond to the light receiving area; an electron transport region disposed on the first to third light emitting layers and the light receiving layer; a second electrode disposed on the electron transport region; a first liquid crystal electrode disposed on the second electrode to overlap the light receiving layer; a second liquid crystal electrode disposed on the first liquid crystal electrode; and a liquid crystal layer disposed between the first liquid crystal electrode and the second liquid crystal electrode, the liquid crystal layer including a dispersion medium and a plurality of liquid crystal molecules dispersed in the dispersion medium.

In an embodiment, the electronic device may further include a color filter layer disposed between the light-receiving layer and the first liquid crystal electrode.

In an embodiment, the color filter layer may transmit light in a wavelength region of about 750 nm or more and about 2500 nm or less or light in a wavelength region of about 500 nm or more and about 600 nm or less, wherein the light receiving element may detect light in a wavelength region of about 750 nm or more and about 2500 nm or less or light in a wavelength region of about 500 nm or more and about 600 nm or less.

In an embodiment, when there is no voltage difference between the first liquid crystal electrode and the second liquid crystal electrode, the liquid crystal layer may operate in a first mode in which the liquid crystal molecules are irregularly arranged; and when there is a voltage difference between the first liquid crystal electrode and the second liquid crystal electrode, the liquid crystal layer may operate in a second mode in which the liquid crystal molecules are regularly arranged.

In an embodiment, in the second mode, a major axis direction of the liquid crystal molecules may be substantially parallel to a direction in which the first liquid crystal electrode and the second liquid crystal electrode are stacked, or may be perpendicular to a direction in which the first liquid crystal electrode and the second liquid crystal electrode are stacked.

In an embodiment, the liquid crystal layer may include: a first sub liquid crystal layer disposed on the first liquid crystal electrode and including the liquid crystal molecules; and a second sub liquid crystal layer disposed between the first sub liquid crystal layer and the second liquid crystal electrode and including the liquid crystal molecules, wherein the first sub liquid crystal layer and the second sub liquid crystal layer may include different materials.

In an embodiment, in any one of the first sub liquid crystal layer and the second sub liquid crystal layer, the liquid crystal molecules may be nematic liquid crystals, and in the other one, the liquid crystal molecules may be cholesteric liquid crystal.

In an embodiment, the electronic device may further include an input detection layer disposed on the second electrode and overlapping the first to third light emitting layers.

BRIEF DESCRIPTION OF THE FIGURES

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
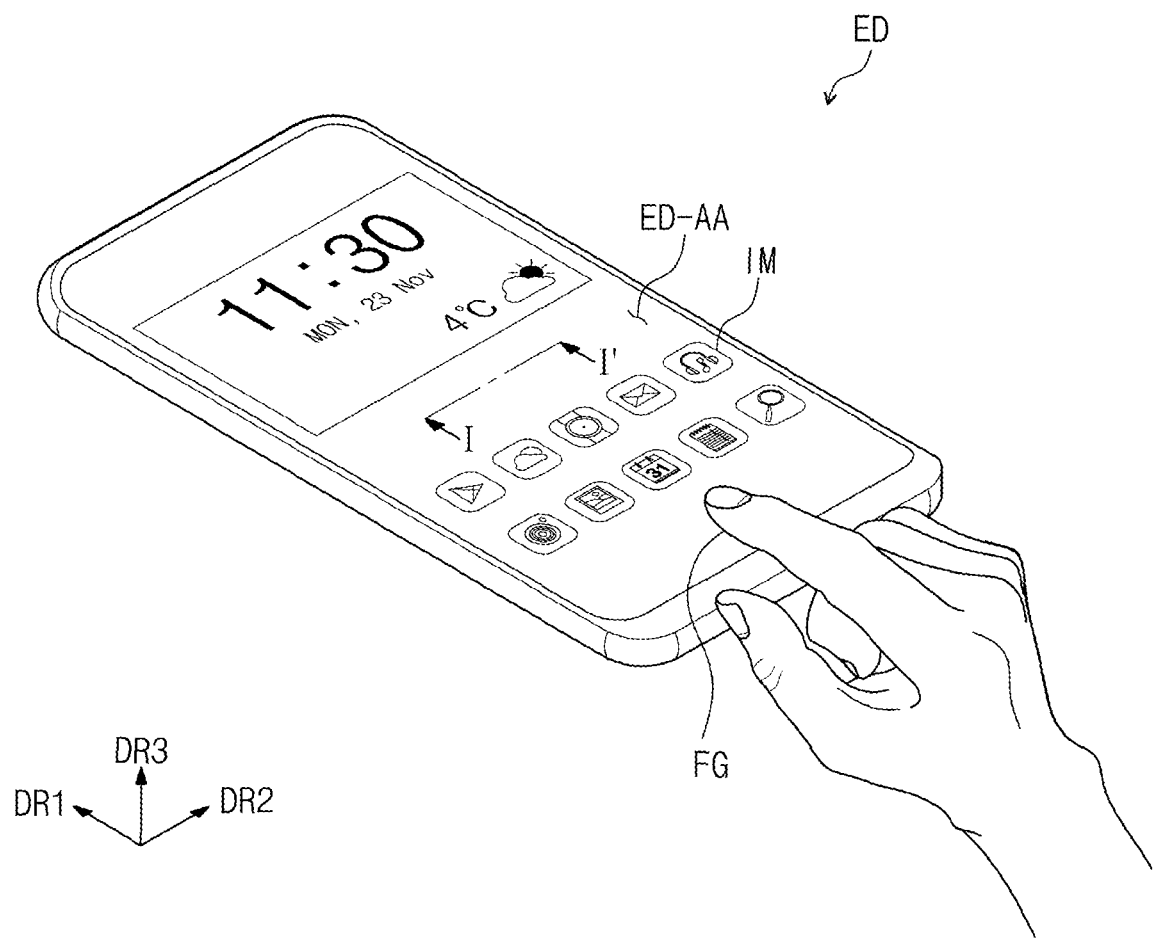
FIG. 1 is a perspective view illustrating an electronic device according to an embodiment of the present disclosure.

Because the present disclosure may have one or more suitable changes and may have one or more suitable forms, specific embodiments are illustrated in the drawings and described in more detail in the text. However, this is not intended to limit the present disclosure to specific embodiments, and should be understood to include all modifications, equivalents and substitutes included in the spirit and scope of the present disclosure.

In this specification, when an element (or region, layer, part, etc.) is referred to as being "on", "connected to", or "coupled to" another element, it refers to that it may be directly placed on/connected to/coupled to other components, or a third component may be arranged between them.

In some embodiments, in the present specification, "directly disposed" may refer to that there is no layer, film, region, plate, and/or the like added between a portion such as a layer, film, region, or plate and another portion. For example, "directly disposed" may refer to disposing between two layers or two members without using an additional member such as an adhesive member.

Like reference numerals refer to like elements. Additionally, in the drawings, the thicknesses, proportions, and dimensions of components are exaggerated for effective description.

"And/or" includes all of one or more combinations defined by related components.

It will be understood that the terms "first" and "second" are used herein to describe one or more suitable components but these components should not be limited by these terms. The above terms are used only to distinguish one component from another. For example, a first component may be referred to as a second component and vice versa without departing from the scope of the present disclosure. The terms of a singular form may include plural forms unless otherwise specified.

In some embodiments, terms such as "below", "the lower side", "on", and "the upper side" are used to describe a relationship of configurations shown in the drawing. The terms are described as a relative concept based on a direction shown in the drawing. In the present specification, "disposed on" may refer to a case of being disposed not only on the upper part of any one member but also on the lower part.

Unless otherwise defined, all terms (including technical and scientific terms) used herein have the same meaning as commonly understood by one of ordinary skill in the art to which this present disclosure belongs. In some embodiments, terms such as terms defined in commonly used dictionaries should be interpreted as having a meaning consistent with the meaning in the context of the related technology, and it should not be construed in an overly ideal or overly formal sense unless explicitly defined here.

In one or more suitable embodiments of the present disclosure, the term "include," "comprise," "including," or "comprising," specifies a property, a region, a fixed number, a step, a process, an element and/or a component but does not exclude other properties, regions, fixed numbers, steps, processes, elements and/or components.

Hereinafter, an electronic device according to an embodiment of the present disclosure will be described with reference to the drawings.

Figure 2:
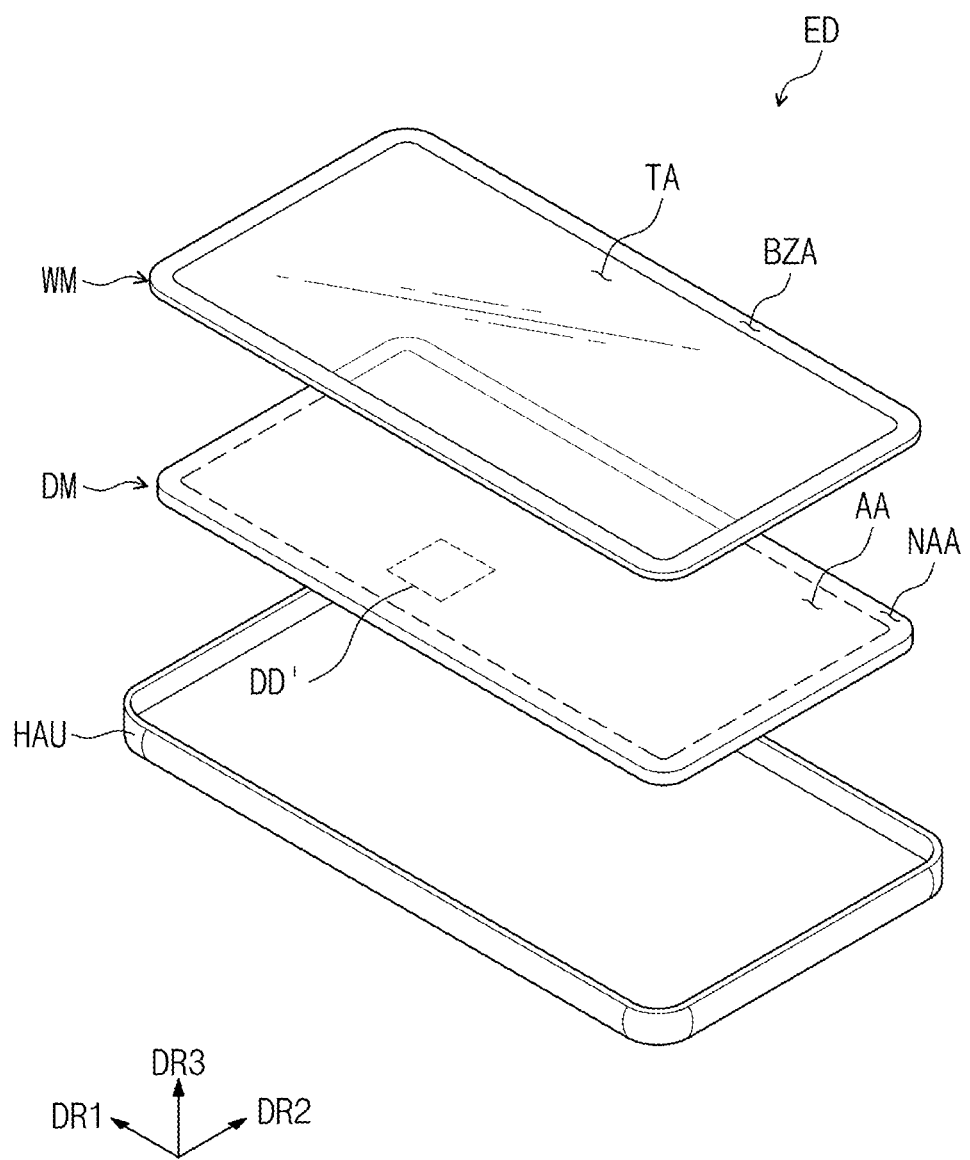
FIG. 2 is an exploded perspective view illustrating an electronic device according to an embodiment of the present disclosure.
Figure 3:
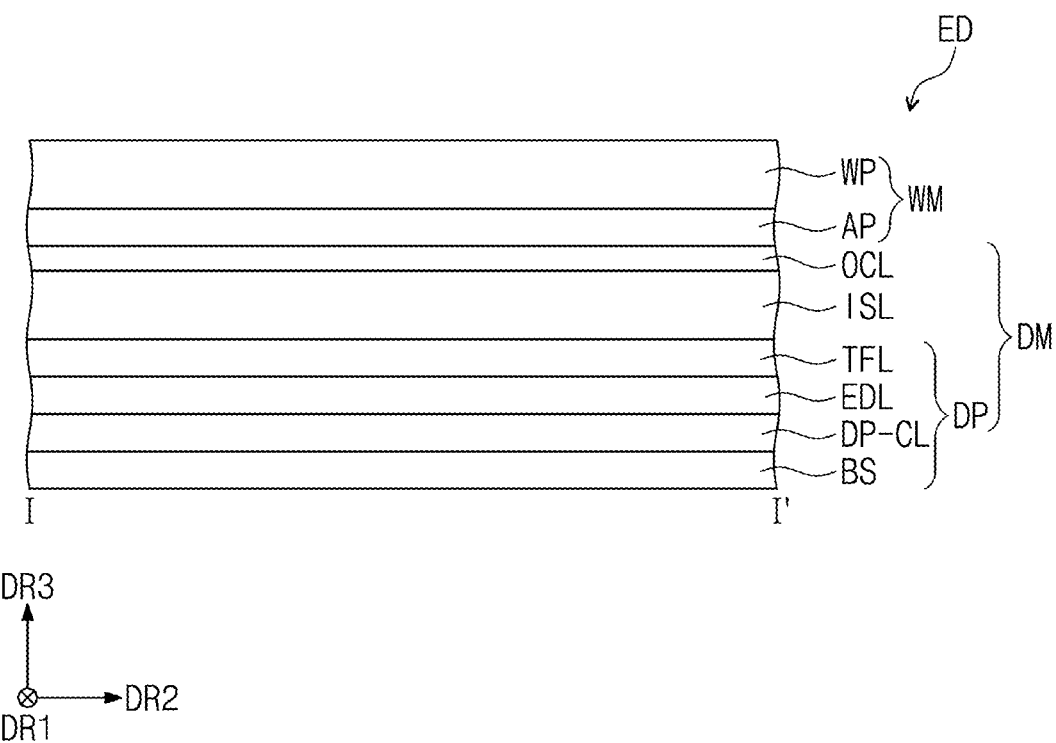
FIG. 3 is a cross-sectional view schematically illustrating a portion corresponding to the line I-I' of FIG. 1.

FIG. 1 is a perspective view illustrating an electronic device according to an embodiment of the present disclosure. FIG. 2 is an exploded perspective view illustrating an electronic device according to an embodiment of the present disclosure. FIG. 3 is a cross-sectional view schematically illustrating a portion corresponding to line I-I' of FIG. 1.

The electronic device ED according to an embodiment shown in FIGS. 1 to 3 may be a device activated according to an electrical signal. For example, the electronic device ED may be a mobile phone, a tablet, a car navigation system, a game machine, or a wearable device, but embodiments are not limited thereto. FIG. 1 exemplarily shows that the electronic device ED is a mobile phone.

The electronic device ED may display the image IM through the active area ED-AA. The active area ED-AA may include a plane defined by the first direction axis DR1 and the second direction axis DR2. The active area ED-AA may further include a curved surface bent from at least one side of a plane defined by the first direction axis DR1 and the second direction axis DR2. For example, the active area ED-AA may include only the plane, and the active area ED-AA may further include at least two or more, for example, four curved surfaces bent from four sides of the plane, respectively.

In some embodiments, in FIG. 1 and the following drawings, the first direction axis DR1 to the fourth direction axis DR4 are shown, and the directions indicated by the first to fourth direction axes DR1, DR2, DR3, and DR4 described herein are relative concepts and may be converted into other directions. Also, directions indicated by the first to fourth direction axes DR1, DR2, DR3, and DR4 may be described as the first to fourth directions, and the same reference numerals may be used.

In the present specification, the first direction axis DR1 and the second direction axis DR2 may be orthogonal to each other, and the third direction axis DR3 may be a direction normal to a plane defined by the first direction axis DR1 and the second direction axis DR2. The direction of the fourth direction axis DR4 may be a direction between the direction of the first direction axis DR1 and the direction of the second direction axis DR2.

The thickness direction of the electronic device ED may be substantially parallel to the third direction axis DR3 which is a direction normal to a plane defined by the first direction axis DR1 and the second direction axis DR2. In the present specification, the front surface (or upper surface) and the rear surface (or lower surface) of the members constituting the electronic device ED may be defined based on the third direction axis DR3.

The image IM provided by the electronic device ED according to an embodiment may include a still image as well as a dynamic image. In FIG. 1, a watch window and icons are illustrated as an example of the image IM. The surface on which the image IM is displayed may correspond to the front surface of the electronic device ED and may correspond to the front surface of the window member WM.

In some embodiments, the electronic device ED according to an embodiment may sense a user's input applied from the outside. The user's input includes one or more suitable types (kinds) of external inputs such as part of the user's body, light, heat, or pressure. The electronic device ED according to an embodiment may detect a user's input through an active area ED-AA and respond to the sensed input signal. In some embodiments, a user's input applied to the side or rear surface of the electronic device ED may also be sensed according to the design of the provided electronic device ED, and the present disclosure is not limited to any one embodiment.

For example, the electronic device ED according to an embodiment may detect biometric information such as a user's fingerprint FG applied from the outside. A fingerprint recognition area may be provided in the active area ED-AA of the electronic device ED. The fingerprint recognition area may be provided in all areas of the active area ED-AA, or may be provided in some areas of the active area ED-AA.

Referring to FIGS. 2 and 3, the electronic device ED according to an embodiment may include a display module DM, a window member WM, and a housing HAU. In an embodiment, the window member WM and the housing HAU may be combined to configure the appearance of the electronic device ED.

The display module DM according to an embodiment may be divided into an active area AA and a peripheral area NAA. The active area AA may be an area activated according to an electrical signal. As described above, the active area AA may be a portion that displays an image or senses an external input.

The peripheral area NAA may be an area located adjacent to at least one side of the active area AA. The peripheral area NAA may be disposed around (e.g., surrounding) the active area AA. However, the embodiment is not limited thereto, and a part of the peripheral area NAA may not be provided in an embodiment, unlike that illustrated in FIG. 2 and/or the like. A driving circuit or a driving wire for driving the active area AA may be disposed in the peripheral area NAA.

The display module DM according to an embodiment may include a display panel DP and an input detection layer ISL. The display module DM may further include an organic planarization layer OCL disposed on the input detection layer ISL. In some embodiments, although not shown in FIG. 3, the electronic device ED according to an embodiment may include the liquid crystal member LM (see FIG. 5) on the same layer as the input detection layer ISL. The liquid crystal member LM (see FIG. 5) will be described in more detail with reference to FIG. 5.

The display panel DP may include a base layer BS and a display element layer EDL disposed on the base layer BS. In some embodiments, the display panel DP may include a base layer BS, a circuit layer DP-CL disposed on the base layer BS, a display element layer EDL disposed on the circuit layer DP-CL, and an encapsulation layer TFL disposed on the display element layer EDL. The encapsulation layer TFL may cover the display element layer EDL.

In some embodiments, the electronic device ED according to an embodiment may further include a window member WM disposed on the display module DM. The window member WM may include a window WP and an adhesive layer AP, and the adhesive layer AP may be disposed between the organic planarization layer OCL and the window WP. The adhesive layer AP may be an optically clear adhesive film (OCA) or an optically clear adhesive resin layer (OCR). In some embodiments, in an embodiment, the adhesive layer AP may not be provided.

The window WP may cover the entire outside of the display module DM. The window WP may have a shape corresponding to the shape of the display module DM. In the electronic device ED according to an embodiment, the window WP may include an optically transparent insulating material. The window WP may be a glass substrate or a polymer substrate. For example, the window WP may be a tempered glass substrate that has been tempered. The window WP may correspond to the uppermost layer of the electronic device ED.

Also, in the electronic device ED according to an embodiment, the window member WM may be divided into a transmission portion TA and a bezel portion BZA. The transmission portion TA may be a portion corresponding to the active area AA of the display module DM, and the bezel portion BZA may be a portion corresponding to the peripheral area NAA of the display module DM.

The front surface of the window member WM including the transmission portion TA and the bezel portion BZA corresponds to the front surface of the electronic device ED. The user may recognize an image provided through the transmission portion TA corresponding to the front surface of the electronic device ED.

The bezel portion BZA may define a shape of the transmission portion TA. The bezel portion BZA is adjacent to the transmission portion TA, and may surround the transmission portion TA. However, the embodiment is not limited to the illustrated, and the bezel portion BZA may be disposed adjacent to only one side of the transmission portion TA, or a portion thereof may not be provided.

In the electronic device ED according to an embodiment, a portion of the electronic device ED viewed through the bezel portion BZA may have a relatively low light transmittance compared to a portion viewed through the transmission portion TA. Also, in the electronic device ED according to an embodiment, the bezel portion BZA may be a portion recognized as having a set or predetermined color.

The electronic device ED according to an embodiment may include an organic planarization layer OCL. For example, the organic planarization layer OCL may be to reduce the reflectance of external light incident from the outside, or to absorb and block/reduce a portion of the light incident from the outside.

The input detection layer ISL included in the electronic device ED according to an embodiment may overlap the light emitting elements ED-R, ED-G, and ED-B, and may be disposed on the display panel DP. An input detection layer ISL may detect an external input applied from the outside. The external input may be a user's input. The user's input may include one or more suitable types (kinds) of external inputs such as a part of the user's body, light, heat, pen, or pressure.

Figure 4:
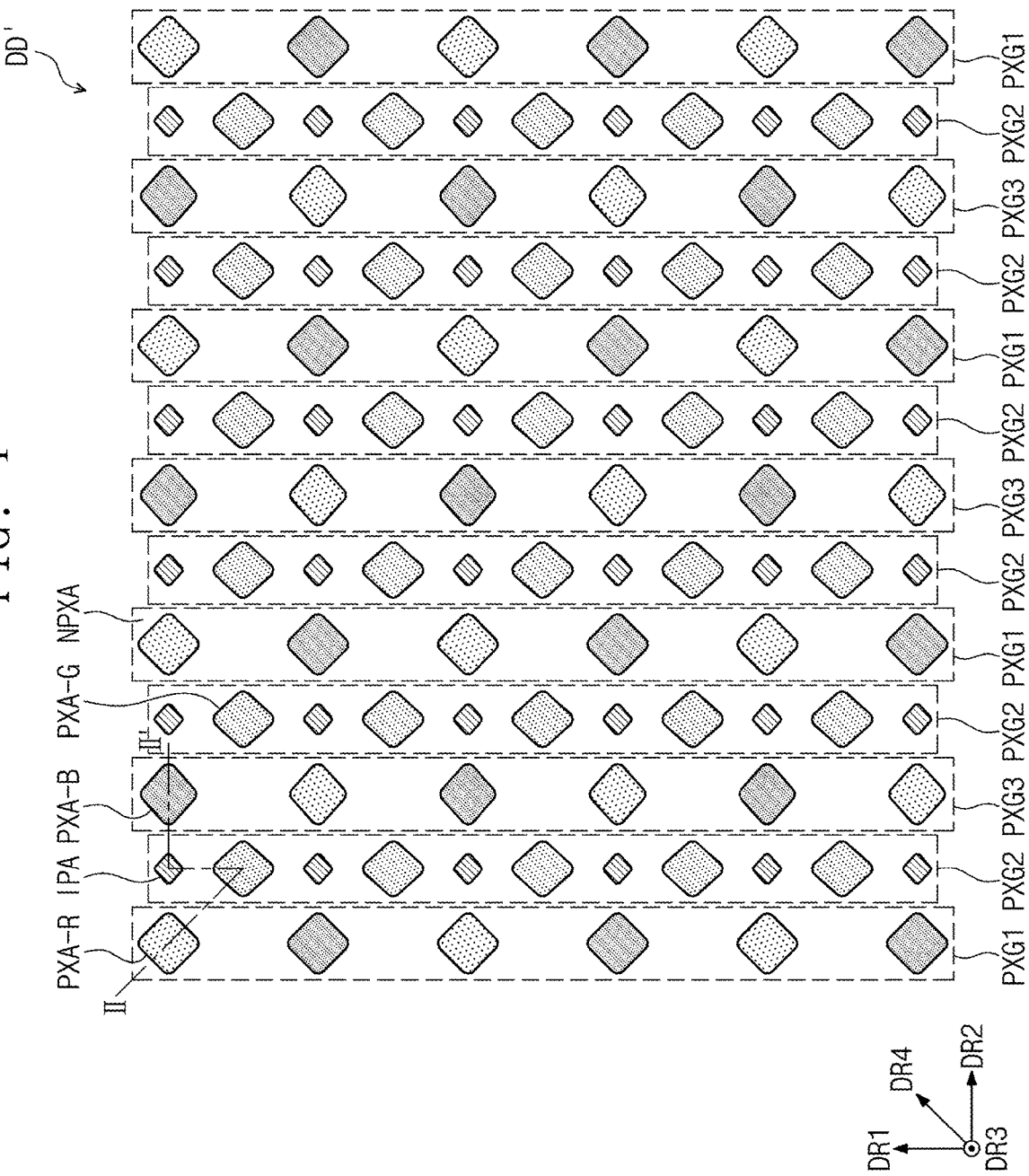
FIG. 4 is a plan view illustrating a part of a display module according to an embodiment of the present disclosure.
Figure 5:
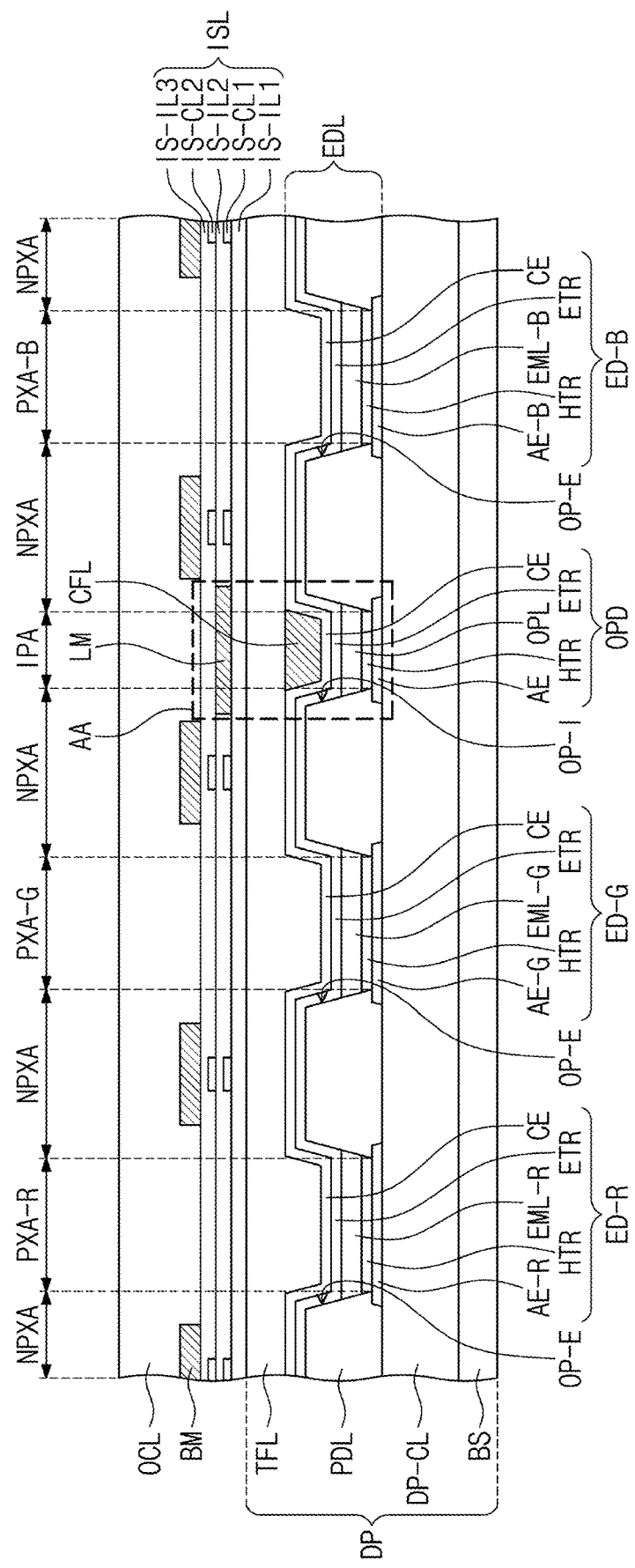
FIG. 5 is a cross-sectional view illustrating a part of a display module according to an embodiment of the present disclosure.

FIG. 4 is a plan view illustrating a part of a display module according to an embodiment of the present disclosure. FIG. 5 is a cross-sectional view illustrating a part of a display module according to an embodiment of the present disclosure. FIG. 4 is a plan view illustrating a region DD' of FIG. 2, and FIG. 5 is a cross-sectional view illustrating a portion corresponding to line II-II' of FIG. 4.

A display module DM according to an embodiment may include a plurality of light emitting areas PXA-R, PXA-G, and PXA-B and a light receiving area IPA arranged in an active area AA. The display module DM includes a red light emitting area PXA-R emitting red light, a green light emitting area PXA-G emitting green light, and a blue light emitting area PXA-B emitting blue light. In some embodiments, the display module DM may include a light receiving area IPA that receives and senses the incident light reflected from the external object. A non-light emitting area NPXA may be disposed between the light emitting areas PXA-R, PXA-G, and PXA-B and between the light emitting areas PXA-R, PXA-G, and PXA-B and the light receiving area IPA. Each of the light emitting areas PXA-R, PXA-G, and PXA-B, and the light emitting areas PXA-R, PXA-G, and PXA-B and the light receiving area IPA may be divided by the non-light emitting area NPXA. The non-light emitting area NPXA may enclose each of the light emitting areas PXA-R, PXA-G, and PXA-B and the light receiving area IPA.

In one embodiment, areas of the light emitting areas emitting light of different wavelength ranges among the plurality of light emitting areas PXA-R, PXA-G, and PXA-B may be different from each other. In this case, the area may refer to an area when viewed on a plane defined by the first direction axis DR1 and the second direction axis DR2.

However, the embodiment is not limited thereto, and the light emitting areas PXA-R, PXA-G, and PXA-B may have the same area, or the light emitting areas PXA-R, PXA-G, and PXA-B may be provided with an area ratio different from that shown in FIG. 5. In some embodiments, the light emitting areas PXA-R, PXA-G, and PXA-B may emit light of a color other than red light, green light, and blue light, or may have a planar shape different from the illustrated shape.

On the other hand, in one embodiment, the area of the light receiving area IPA on the plane may be smaller than that of each of the red light emitting area PXA-R, the blue light emitting area PXA-B, and the green light emitting area PXA-G. However, the embodiment is not limited thereto, and the area of the light receiving area IPA may be equal to or larger than the area of any one light emitting area among the red light emitting area PXA-R, the blue light emitting area PXA-B, and the green light emitting area PXA-G.

Referring to FIG. 4, the red light emitting areas PXA-R and the blue light emitting areas PXA-B may be alternately arranged along the first directional axis DR1 to form a first group PXG1. The green light emitting areas PXA-G and the light receiving areas IPA may be alternately arranged along the first directional axis DR1 to form a second group PXG2. In some embodiments, the blue light emitting areas PXA-B and the red light emitting areas PXA-R may be alternately arranged along the first directional axis DR1 to form a third group PXG3.

The first group PXG1 to the third group PXG3 may be sequentially arranged in the second direction axis DR2 direction. Each of the first group PXG1 to the third group PXG3 may be provided in plurality. In one embodiment shown in FIG. 4, the first group PXG1, the second group PXG2, the third group PXG3, and the second group PXG2 form one repeating unit along the second direction axis DR2, and these repeating units may be repeatedly arranged in the direction of the second direction axis DR2.

In one embodiment, one green light emitting area PXA-G is spaced apart from one red light emitting area PXA-R or one blue light emitting area PXA-B in the fourth direction axis DR4 direction. The direction of the fourth direction axis DR4 may be a direction between the direction of the first direction axis DR1 and the direction of the second direction axis DR2.

Further, in one embodiment, the light receiving area IPA is spaced apart from each of the light emitting areas PXA-R, PXA-G, and PXA-B, and may be disposed to be spaced apart from each other in the second direction axis DR2 direction between the red light emitting area PXA-R and the blue light emitting area PXA-B. The light receiving area IPA and the green light emitting area PXA-G may be alternately arranged one by one along the first directional axis DR1.

The arrangement structure of the light emitting areas PXA-R, PXA-G, and PXA-B illustrated in FIG. 4 may be referred to as a pentile structure. However, the arrangement structure of the light emitting areas PXA-R, PXA-G, and PXA-B in the electronic device according to an embodiment is not limited to the arrangement structure illustrated in FIG. 4. For example, in one embodiment, the light emitting areas PXA-R, PXA-G, and PXA-B may have a stripe structure in which the red light emitting area PXA-R, the green light emitting area PXA-G, and the blue light emitting area PXA-B are sequentially alternately arranged along the first direction axis DR1 or the second direction axis DR2. Further, in the stripe arrangement structure, the light receiving area IPA may form the same row or the same column as the green light emitting area PXA-G to form one stripe arrangement. However, in one embodiment, the arrangement of the light receiving area IPA and the light emitting areas PXA-R, PXA-G, and PXA-B and the arrangement ratio of the light receiving area IPA and the light emitting areas PXA-R, PXA-G, and PXA-B may be different from those described above.

FIG. 5 is a cross-sectional view of a portion of a display module according to an embodiment of the present disclosure. The cross-sectional view of FIG. 5 shows an example part of the light emitting areas PXA-R, PXA-G, and PXA-B and the light receiving area IPA shown in FIG. 4. For example, FIG. 5 is a cross-sectional view illustrating a part of the electronic device ED (see FIG. 3) according to an embodiment of the present disclosure.

The electronic device according to an embodiment includes the base layer BS in the display module DM. The base layer BS may be a member that provides a base surface on which the display element layer EDL is disposed. The base layer BS may be a glass substrate, a metal substrate, a polymer substrate, and/or the like. However, the embodiment is not limited thereto, and the base layer BS may be an inorganic layer, an organic layer, or a composite material layer.

The base layer BS may have a multi-layered structure. For example, the base layer BS may have a three-layer structure of a synthetic resin layer, an adhesive layer, and a synthetic resin layer. In particular, the synthetic resin layer may include a polyimide-based resin. In some embodiments, the synthetic resin layer may include at least one of acrylic resin, methacrylate resin, polyisoprene resin, vinyl resin, epoxy resin, urethane resin, cellulose resin, siloxane resin, polyamide resin, or perylene resin. On the other hand, in the present specification "~~"-based resin refers to include a functional group of "~~".

The circuit layer DP-CL is disposed on the base layer BS. The circuit layer DP-CL may include an insulating layer, a semiconductor pattern, a conductive pattern, and a signal line. An insulating layer, a semiconductor layer, and a conductive layer are formed on the base layer BS by a method such as coating or deposition, and thereafter, the insulating layer, the semiconductor layer, and the conductive layer may be selectively patterned through a plurality of photolithography processes. Thereafter, a semiconductor pattern, a conductive pattern, and a signal line included in the circuit layer DP-CL may be formed.

The display element layer EDL may be disposed on the circuit layer DP-CL. The display element layer EDL may include light emitting element ED-R, ED-G, and ED-B and a light receiving element OPD. For example, the light emitting elements ED-R, ED-G, and ED-B included in the display element layer EDL may include an organic light emitting element, a quantum dot light emitting element, a micro LED light emitting element, or a nano LED light emitting element. However, the embodiments of the present disclosure are not limited thereto, and the light emitting elements ED-R, ED-G, and ED-B may include one or more suitable embodiments as long as light is generated or the amount of light may be controlled or selected according to an electrical signal.

The light receiving element OPD may be an optical sensor that receives and recognizes light reflected by an external object. For example, the light receiving element OPD may be a light sensor that recognizes light in a visible light region reflected by an external object. In an embodiment, the light receiving element OPD may be a biometric sensor that recognizes light reflected from a user's body part, such as a fingerprint or vein, and converts an optical signal into an electrical signal.

The display element layer EDL includes a pixel defining film PDL in which opening parts OP-E and OP-I are defined, and based on the pixel defining film PDL, the light emitting elements ED-R, ED-G, and ED-B and the light receiving element OPD may be separated and distinguished. In the pixel defining film PDL, a first opening part OP-E in which the configuration of the light emitting elements ED-R, ED-G, and ED-B is arranged and a second opening part OP-I in which the configuration of the light receiving element OPD is arranged may be defined.

The pixel defining film PDL may be disposed on the base layer BS. A pixel defining film PDL is disposed on the circuit layer DP-CL, and in the opening parts OP-E and OP-I, a portion of the upper surfaces of the first electrodes AE-R, AE-G, AE-B, and AE may be exposed. In this embodiment, the light emitting areas PXA-R, PXA-G, and PXA-B and the light receiving area IPA are defined to correspond to the areas of the first electrode AE-R, AE-G, AE-B, and AE exposed in the opening parts OP-E and OP-I.

In an embodiment, the pixel defining film PDL may be formed of a polymer resin. For example, the pixel defining film PDL may be formed of a polyacrylate-based resin or a polyimide-based resin. In some embodiments, the pixel defining film PDL may be formed by further including an inorganic material in addition to the polymer resin. In some embodiments, the pixel defining film PDL may be formed by including a light absorbing material, or may be formed by including a black pigment or a black dye. A pixel defining film PDL formed including a black pigment or black dye may implement a black pixel defining film. When forming the pixel defining film PDL, carbon black and/or the like may be used as a black pigment or black dye, but embodiments are not limited thereto.

In some embodiments, the pixel defining film PDL may be formed of an inorganic material. For example, the pixel defining film PDL may be formed including silicon nitride (SiNx), silicon oxide (SiOx), silicon oxynitride (SiOxNy), and/or the like.

The light emitting elements ED-R, ED-G, and ED-B may include first electrodes AE-R, AE-G, and AE-B, a second electrode CE, and light emitting layers EML-R, EML-G, and EML-B, respectively. The first electrodes AE-R, AE-G, and AE-B may be exposed in the first opening part OP-E. In the present specification, the first electrodes AE-R, AE-G, and AE-B constituting the light emitting elements ED-R, ED-G, and ED-B may be referred to as light emitting electrodes. In one embodiment, the display element layer EDL may include a red light emitting element ED-R disposed to correspond to the red light emitting area PXA-R and emitting red light, a green light emitting element ED-G disposed corresponding to the green light emitting area PXA-G and emitting green light, and a blue light emitting element ED-B disposed to correspond to the blue light emitting area PXA-B and emitting blue light. The red light emitting element ED-R includes a first electrode AE-R and a second electrode CE that face each other, and a red light emitting layer EML-R disposed between the first electrode AE-R and the second electrode CE. The green light emitting element ED-G includes a first electrode AE-G and a second electrode CE facing each other, and a green light emitting layer EML-G disposed between the first electrode AE-G and the second electrode CE, and the blue light emitting element ED-B includes a first electrode AE-B and a second electrode CE facing each other, and a blue light emitting layer EML-B disposed between the first electrode AE-B and the second electrode CE.

The light receiving element OPD may include a first electrode AE, a second electrode CE, and a light receiving layer OPL. The first electrode AE may be exposed at the second opening part OP-I. In the present specification, the first electrode AE constituting the light receiving element OPD may be referred to as a light receiving electrode.

In the display element layer EDL, the first electrodes AE-R, AE-G, AE-B, and AE may be formed of a metal material, a metal alloy, or a conductive compound. The first electrodes AE-R, AE-G, AE-B, and AE may be an anode or a cathode. However, the embodiment is not limited thereto. Also, the first electrodes AE-R, AE-G, AE-B, and AE may be a pixel electrode or a sensing electrode. The first electrodes AE-R, AE-G, AE-B, and AE may be a transmissive electrode, a transflective electrode, or a reflective electrode. When the first electrodes AE-R, AE-G, AE-B, and AE are transmissive electrodes, they may include a transparent metal oxide, for example, indium tin oxide (ITO), indium zinc oxide (IZO), zinc oxide (ZnO), indium tin zinc oxide (ITZO) and/or the like. When the first electrodes AE-R, AE-G, AE-B, and AE are transflective electrodes or reflective electrodes, they may include Ag, Mg, Cu, Al, Pt, Pd, Au, Ni, Nd, Ir, Cr, Li, Ca, LiF/Ca, LiF/Al, Mo, Ti, W or a compound thereof or mixtures (e.g., a mixture of Ag and Mg).

The second electrode CE may be a common electrode. The second electrode CE may be a cathode or an anode, but the embodiment is not limited thereto. For example, when the first electrodes AE-R, AE-G, AE-B, and AE are anodes, the second electrode CE may be a cathode, and when the first electrodes AE-R, AE-G, AE-B, and AE are cathodes, the second electrode CE may be an anode.

The second electrode CE may be a transmissive electrode, a transflective electrode, or a reflective electrode. When the second electrode CE is a transmissive electrode, it may be formed of a transparent metal oxide, for example, indium tin oxide (ITO), indium zinc oxide (IZO), zinc oxide (ZnO), or indium tin zinc oxide (ITZO). When the second electrode CE is a transflective electrode or a reflective electrode, it may include Ag, Mg, Cu, Al, Pt, Pd, Au, Ni, Nd, Ir, Cr, Li, Ca, LiF/Ca, LiF/Al, Mo, Ti, Yb, W, or a compound or mixture (e.g., AgMg, AgYb, or MgAg) including these.

On the other hand, the first electrodes AE-R, AE-G, AE-B, and AE included in the display element layer EDL of an embodiment may be transflective electrodes or reflective electrodes, and the second electrode CE may be a transmissive electrode or a transflective electrode. For example, light reflected from an external object may be easily transmitted to the light receiving element OPD by including the transmissive or transflective second electrode CE in one embodiment.

The light emitting layers EML-R, EML-G, and EML-B of the light emitting elements ED-R, ED-G, and ED-B may be disposed on the first opening part OP-E. For example, the light emitting layers EML-R, EML-G, and EML-B may be separately formed in the first opening part OP-E. The light emitting layers EML-R, EML-G, and EML-B may include an organic light emitting material or a quantum dot material.

In some embodiments, each of the light emitting elements ED-R, ED-G, and ED-B may include a hole transport region HTR and an electron transport region ETR. The hole transport region HTR may be disposed between the first electrodes AE-R, AE-G, and AE-B and the light emitting layer EML-R, EML-G, and EML-B, and the electron transport region ETR may be disposed between the light emitting layers EML-R, EML-G, and EML-B and the second electrode CE.

In some embodiments, the light receiving element OPD may be disposed between the first electrode AE and the second electrode CE and may include a light receiving layer OPL disposed within the second opening part OP-I. The light receiving layer OPL may include a light receiving material that receives light and converts the received light into an electrical signal. For example, in an embodiment, the light receiving layer OPL may include an organic light receiving material. In an embodiment, the light receiving layer OPL may include an organic polymer material as a light receiving material, and for example, the light receiving layer OPL may include a conjugated polymer. The light receiving layer OPL may include a thiophene-based conjugated polymer, benzodithiophene-based conjugated polymer, thieno[3,4-c]pyrrole-4,6-dione (TPD)-based conjugated polymer, diketo-pyrrole-pyrrole (DPP))-based conjugated polymer, benzothiadiazole (BT)-based conjugated polymer, and/or the like. However, the embodiment is not limited thereto.

In one embodiment, the light receiving element OPD may detect light of a specific wavelength. For example, light having a wavelength of about 750 nm or more and about 2500 nm or less may be detected. However, this is only an example, and the embodiment is not limited thereto. For example, the light receiving element OPD may detect light having a wavelength of about 500 nm or more and about 600 nm or less. For example, the light receiving element OPD may be to detect near-infrared light or green light.

The light receiving element OPD may include a hole transport region HTR and an electron transport region ETR. The hole transport region HTR may be disposed between the first electrode AE and the light receiving layer OPL, and the electron transport region ETR may be disposed between the light receiving layer OPL and the second electrode CE.

In one embodiment, the hole transport region HTR constituting the light emitting element ED-R, ED-G, and ED-B and the light receiving element OPD may have a single layer made of a single material, a single layer made of a plurality of different materials, or a multilayer structure having a plurality of layers made of a plurality of different materials. For example, the hole transport region HTR may have a structure of a hole injection layer or a single layer of a hole transport layer, or may have a structure of a single layer including a hole injection material and a hole transport material. In one embodiment, the hole transport region HTR included in the light emitting elements ED-R, ED-G, and ED-B and the light receiving element OPD includes a hole transport layer, and may further include a hole injection layer.

In some embodiments, the electron transport region ETR constituting the light emitting element ED-R, ED-G, and ED-B and the light receiving element OPD may have a single layer made of a single material, a single layer made of a plurality of different materials, or a multilayer structure having a plurality of layers made of a plurality of different materials.

For example, the electron transport region ETR may have a single-layer structure of an electron injection layer or an electron transport layer, or may have a single-layer structure including an electron injection material and an electron transport material. In some embodiments, the electron transport region ETR may have a single layer structure made of a plurality of different materials, or may further include a plurality of layers sequentially stacked from the light emitting layers EML-R, EML-G, and EML-B. In one embodiment, the electron transport region ETR included in the light emitting elements ED-R, ED-G, and ED-B and the light receiving element OPD includes an electron transport layer, and may further include an electron injection layer.

Referring to FIG. 5, in an embodiment, the electron transport region ETR may be disposed on the respective light emitting layers EML-R, EML-G, and EML-B of the light emitting elements ED-R, ED-G, and ED-B, or on the light receiving layer OPL of the light receiving element OPD, and may be provided separately by a pixel defining film PDL. In some embodiments, in an embodiment, the electron transport region ETR may be provided as one common layer. The electron transport region ETR may be provided as a common layer across the light emitting elements ED-R, ED-G, ED-B and the light receiving element OPD. The electron transport region ETR may entirely overlap the pixel defining film PDL, the light emitting layers EML-R, EML-G, and EML-B, and the light receiving layer OPL.

The encapsulation layer TFL may be disposed on the display element layer EDL. The encapsulation layer TFL may include at least one inorganic layer and at least one organic layer. For example, the encapsulation layer TFL may include an inorganic layer, an organic layer, and an inorganic layer sequentially stacked, but the layers constituting the encapsulation layer TFL are not limited thereto.

The input detection layer ISL may be disposed on the display element layer EDL to overlap the light emitting elements ED-R, ED-G, and ED-R. An input detection layer ISL may detect an external input applied from the outside. The external input may be a user's input. The user's input may include one or more suitable types (kinds) of external inputs such as a part of the user's body, light, heat, pen, or pressure.

The input detection layer ISL may be formed on the display panel DP through a substantially continuous process. In this case, it may be expressed that the input detection layer ISL is directly disposed on the display panel DP. Directly disposed may refer to that the third component is not disposed between the input detection layer ISL and the display panel DP. For example, a separate adhesive member may not be disposed between the input detection layer ISL and the display panel DP. For example, the input detection layer ISL may be directly disposed on the encapsulation layer TFL.

In some embodiments, the embodiment is not limited thereto, and an adhesive member may be further disposed between the input detection layer ISL and the display panel DP. The input detection layer ISL may include a lower insulating layer IS-IL1, a first conductive layer IS-CL1, an interlayer insulating layer IS-IL2, a second conductive layer IS-CL2, and an upper insulating layer IS-IL3. In an embodiment of the present disclosure, at least one of the lower insulating layer IS-IL1 or the upper insulating layer IS-IL3 may not be provided.

Each of the first conductive layer IS-CL1 and the second conductive layer IS-CL2 may have a single-layer structure or a multi-layer structure stacked along the third direction DR3. The multi-layered conductive layer may include at least two or more of transparent conductive layers and metal layers. The multi-layered conductive layer may include metal layers including different metals. The transparent conductive layer may include indium tin oxide (ITO), indium zinc oxide (IZO), zinc oxide (ZnO), indium tin zinc oxide (ITZO), PEDOT, metal nanowires, or graphene. The metal layer may include molybdenum, silver, titanium, copper, aluminum, or an alloy thereof. For example, each of the first conductive layer IS-CL1 and the second conductive layer IS-CL2 may have a three-layer metal layer structure, for example, a three-layer structure of titanium/aluminum/titanium. A metal having relatively high durability and low reflectance may be applied to the upper/lower layers, and a metal having high electrical conductivity may be applied to the inner layer.

Each of the first conductive layer IS-CL1 and the second conductive layer IS-CL2 includes a plurality of conductive patterns. Hereinafter, it will be described that the first conductive layer IS-CL1 includes the first conductive patterns, and the second conductive layer IS-CL2 includes the second conductive patterns. Each of the first conductive patterns and the second conductive patterns may include sensing electrodes and signal lines connected thereto. The first conductive patterns and the second conductive patterns may be disposed to overlap the light blocking part BM, which will be described later. The light blocking part BM overlaps the first conductive layer IS-CL1 and the second conductive layer IS-CL2 to prevent or reduce reflection of external light by the first conductive layer IS-CL1 and the second conductive layer IS-CL2.

Each of the lower insulating layer IS-IL1, the interlayer insulating layer IS-IL2, and the upper insulating layer IS-IL3 may include an inorganic film or an organic film. In this embodiment, the lower insulating layer IS-IL1 and the interlayer insulating layer IS-IL2 may be inorganic films. Also, the upper insulating layer IS-IL3 may include an organic film.

The electronic device ED of one embodiment may include a liquid crystal member LM disposed on a display element layer EDL and overlapping a light receiving element OPD. The liquid crystal member LM may be disposed on the same layer as the input detection layer ISL. For example, the liquid crystal member LM may be disposed on the same layer as the second insulating layer IS-IL2 included in the input detection layer ISL. The liquid crystal member LM may overlap the light receiving element OPD and be disposed between the first insulating layer IS-IL1 and the third insulating layer IS-IL3.

The liquid crystal member LM may increase the amount of light incident on the light receiving element OPD. The liquid crystal member LM may refract light incident on the liquid crystal member LM to increase the amount of light incident on the light receiving element OPD. In some embodiments, in the liquid crystal member LM, the amount of light transmission may be adjusted according to the alignment of the liquid crystal molecules LC (see FIG. 7A) included in the liquid crystal member LM. Accordingly, as the electronic device ED of an embodiment includes the liquid crystal member LM, even when the polarization layer is not included, only light of a specific wavelength region may pass through the liquid crystal member LM and be incident on the light receiving element OPD. Accordingly, the liquid crystal member LM may improve the sensing sensitivity of the light receiving element OPD. The liquid crystal member LM will be described in more detail later with reference to FIGS. 7A and 7B.

In an embodiment, the organic planarization layer OCL is disposed on the display panel DP. In one embodiment, the organic planarization layer OCL may be disposed directly on the input detection layer ISL. Also, in an embodiment, the light blocking parts BM may be disposed on the display panel DP to overlap the non-light emitting area NPXA. In an embodiment, the light blocking parts BM may overlap the non-light emitting area NPXA and be directly disposed on the input detection layer ISL. In some embodiments, the organic planarization layer OCL may cover the light blocking parts BM.

The light blocking part BM may block or reduce a light leakage phenomenon. The light blocking part BM may be a black matrix. The light blocking part BM may include an organic pigment or dye. The light blocking part BM may include an organic light blocking material or an inorganic light blocking material including a black pigment or a black dye. The light blocking part BM may be formed from a light blocking composition including propylene glycol monomethyl ether acetate, 3-methoxybutyl acetate, and an organic black pigment.

In some embodiments, the light blocking part BM may overlap the pixel defining film PDL. The light blocking part BM may overlap with a pixel defining film PDL that separates the light emitting areas PXA-R, PXA-G, and PXA-B, and separates the light emitting areas PXA-R, PXA-G, and PXA-B from the light receiving area IPA.

The organic planarization layer OCL may be disposed on the input detection layer ISL. The organic planarization layer OCL may be disposed on the input detection layer ISL to protect the input detection layer ISL and planarize the upper surface of the input detection layer ISL. The organic planarization layer OCL may include an organic material such as an acrylic resin or an epoxy resin. An organic planarization layer OCL may be formed by photocuring or thermally curing an organic material such as an acrylic resin or an epoxy resin. The organic planarization layer OCL may be formed of a single layer or a plurality of layers.

In an embodiment, the organic planarization layer OCL may include at least one of a diimmonium-based compound, a polymethine-based compound, an anthraquinone-based compound, a phthalocyanine-based compound, or a naphthalocyanine-based compound.

The electronic device ED according to an embodiment may further include a color filter layer CFL disposed between the light receiving element OPD and the encapsulation layer TFL. The color filter layer CFL may selectively transmit light in a specific wavelength region. For example, the color filter layer CFL may selectively transmit light having a wavelength range of about 750 nm or more and about 2500 nm or less. However, this is only an example, and the embodiment is not limited thereto. For example, the color filter layer CFL may selectively transmit light having a wavelength range of about 500 nm or more and about 600 nm or less. For example, the color filter layer CFL according to an embodiment may selectively transmit near-infrared or green light. In some embodiments, the color filter layer CFL may selectively transmit light in substantially the same wavelength region as that of the light absorbed by the light receiving element OPD. Accordingly, light of a specific wavelength region is selectively incident on the light receiving element OPD by the color filter layer CFL, so that the sensing sensitivity of the light receiving element OPD may be improved. In some embodiments, the electronic device ED according to an embodiment may not include (e.g., may exclude) a separate color filter layer different from the color filter layer CFL shown in FIG. 5 on the input detection layer ISL.

Figure 6:
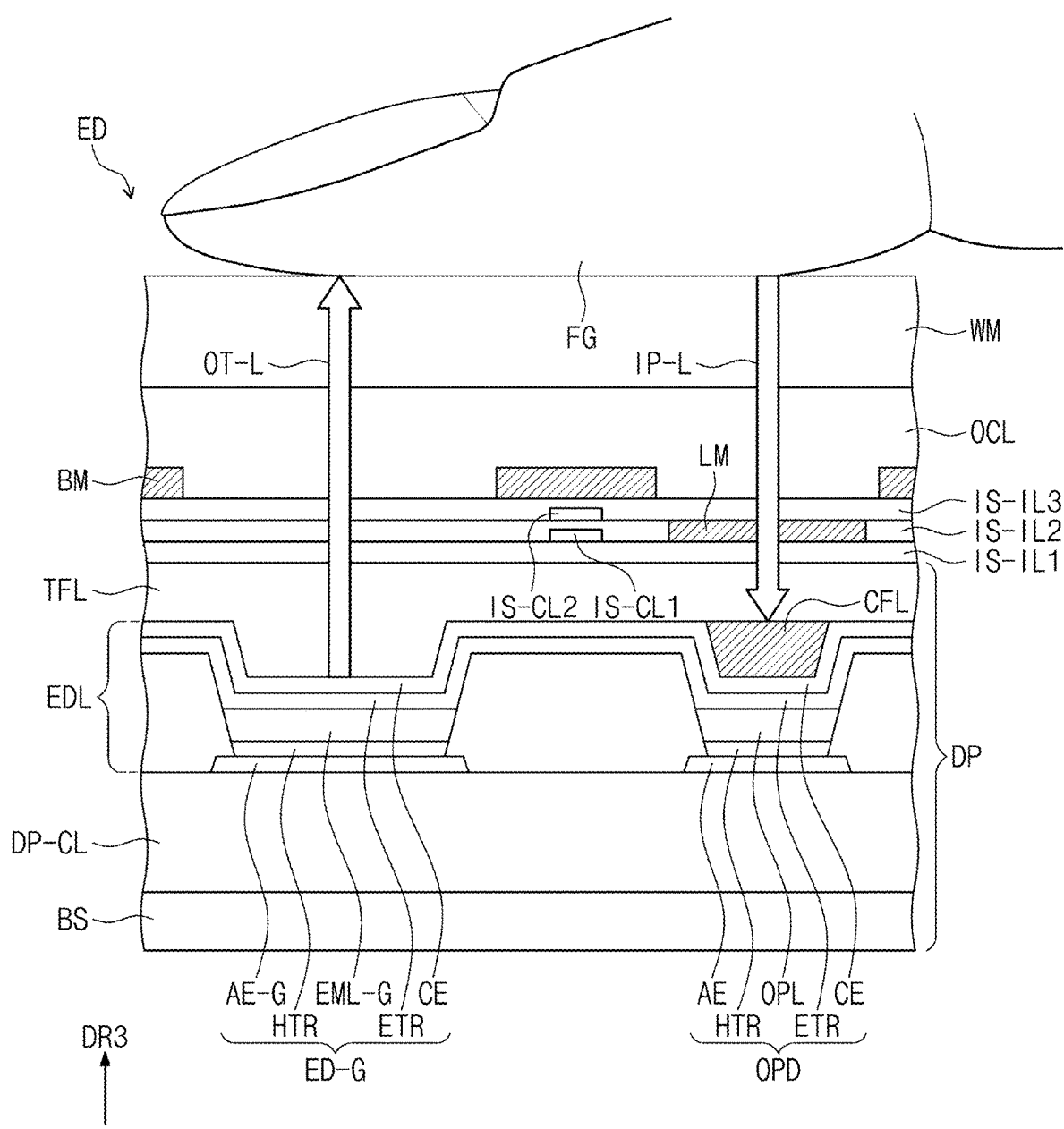
FIG. 6 is a cross-sectional view illustrating an electronic device according to an embodiment of the present disclosure.

FIG. 6 is a cross-sectional view illustrating an electronic device according to an embodiment of the present disclosure. FIG. 6 illustrates a state in which a fingerprint FG, that is, an external input, is recognized.

Referring to FIG. 6, in an electronic device ED according to an embodiment, the light OT-L emitted from the light emitting element ED-G included in the display element layer EDL may be reflected from an external object (e.g., the fingerprint FG in this embodiment) and may be incident on the light receiving element OPD included in the display element layer EDL as reflected light IP-L. The reflected light IP-L incident on the light receiving element OPD may be light having a wavelength range of about 750 nm or more and about 2500 nm or less. However, this is only an example, and the embodiment is not limited thereto. For example, the reflected light IP-L incident to the light receiving element OPD may be light having a wavelength range of about 500 nm or more and about 600 nm or less. The light receiving element OPD receives the incident light and converts the received incident light into an electrical signal and then, changes the driving state of the electronic device ED by recognizing an external input.

Figure 7A:
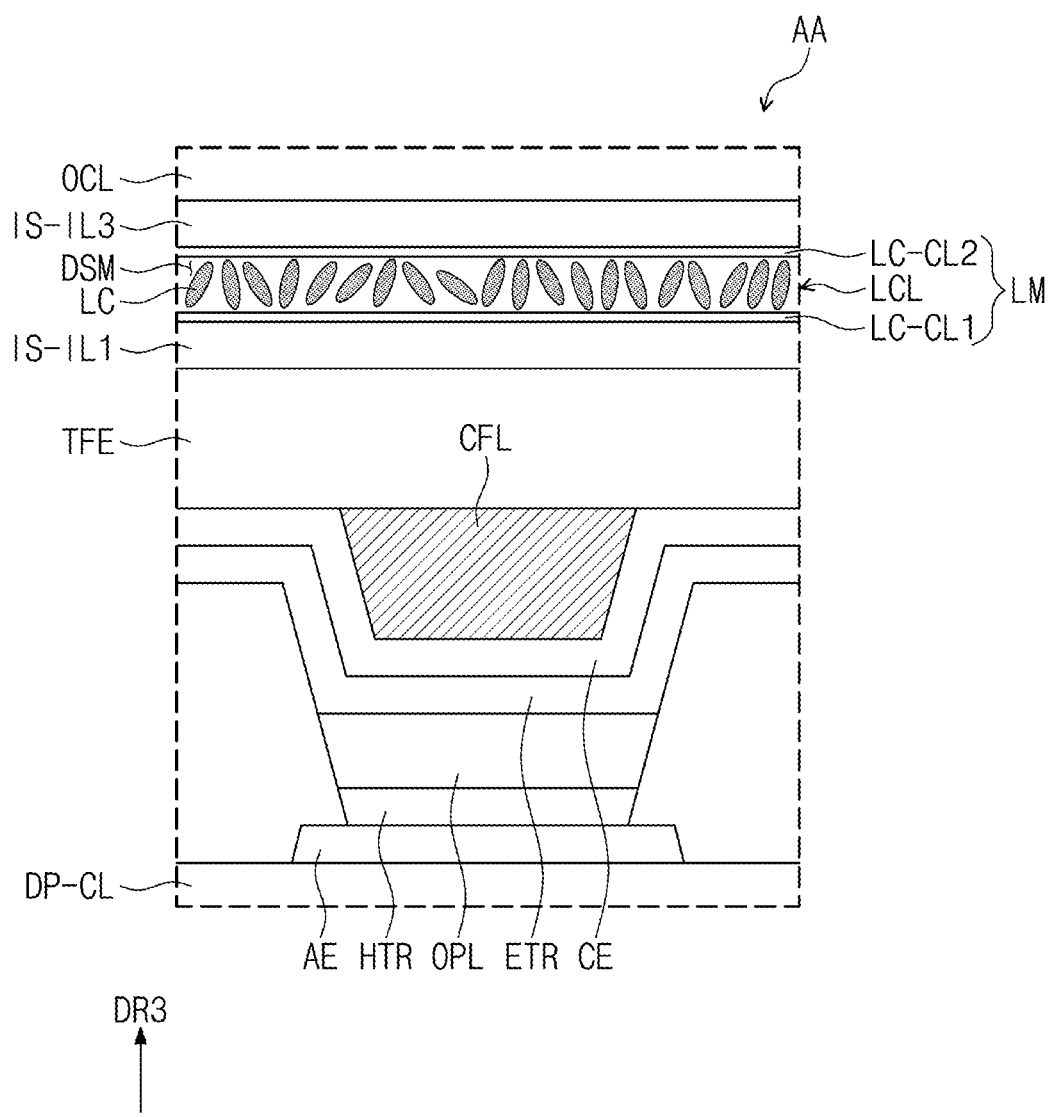
FIG. 7A is a cross-sectional view illustrating a part of a display module according to an embodiment of the present disclosure.
Figure 7B:
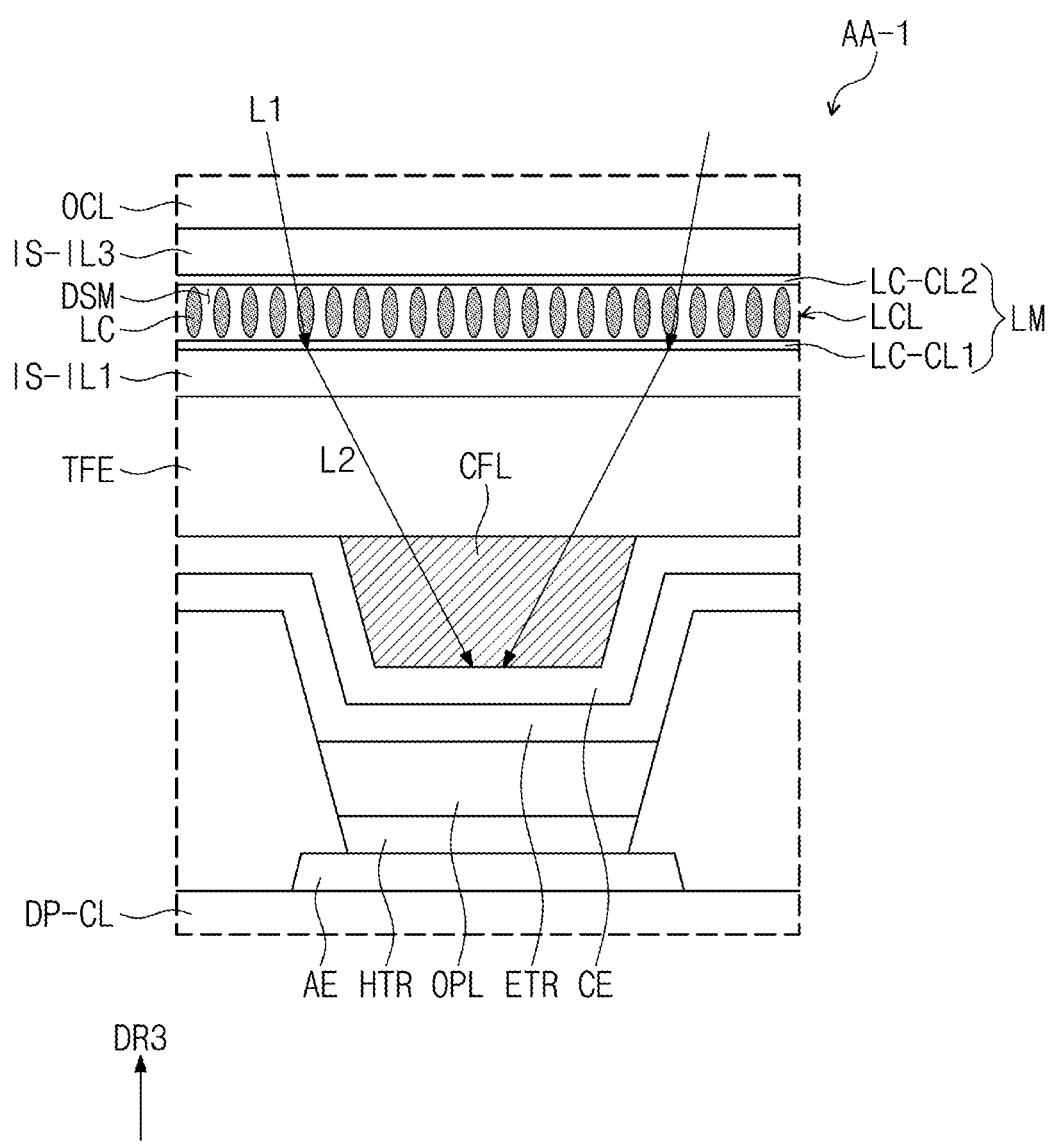
FIG. 7B is a cross-sectional view illustrating a part of a display module according to an embodiment of the present disclosure.
Figure 8:
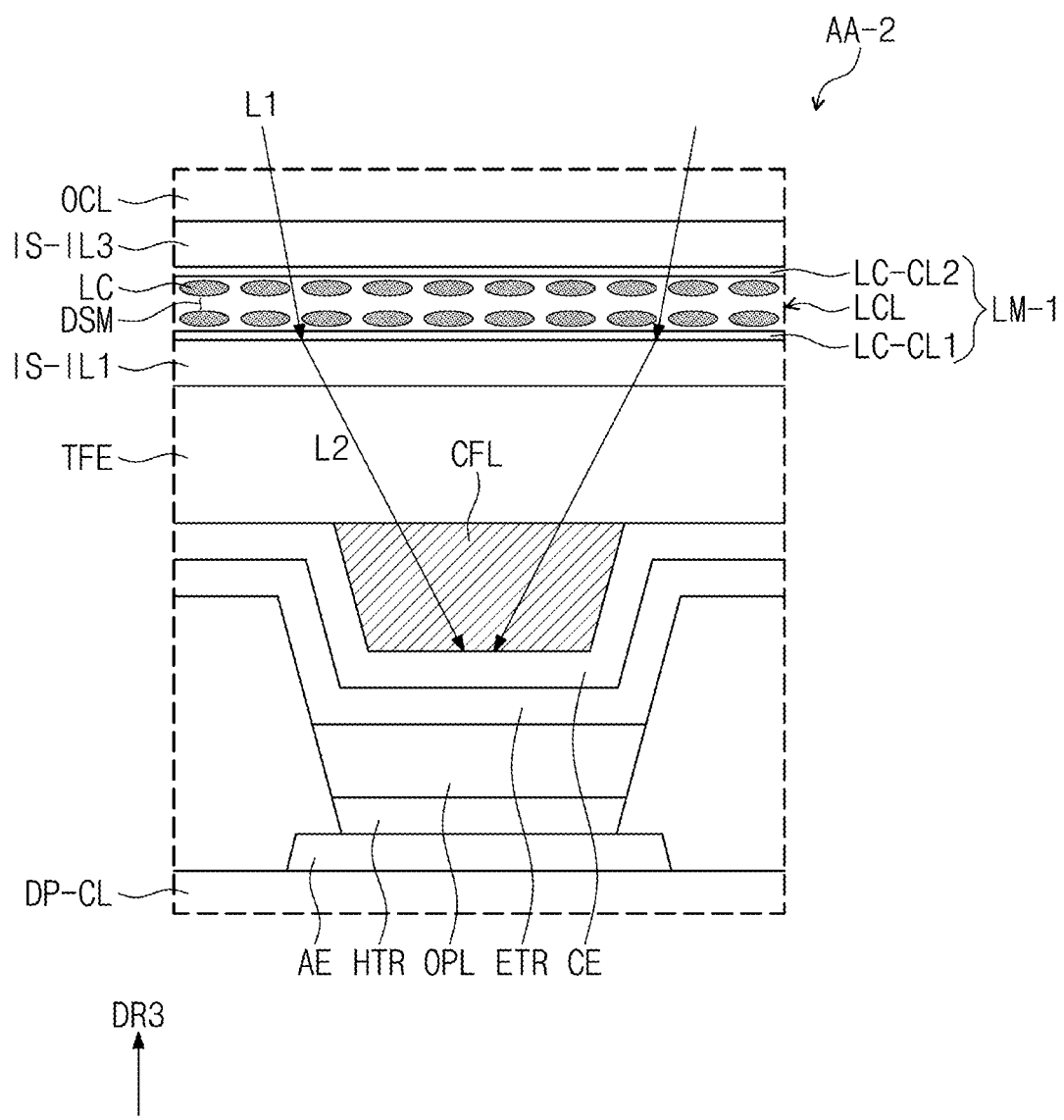
FIG. 8 is a cross-sectional view illustrating a part of a display module according to an embodiment of the present disclosure.

FIGS. 7A and 7B are cross-sectional views illustrating a portion of a display module according to an embodiment of the present disclosure, respectively. FIG. 8 is a cross-sectional view illustrating a part of a display module according to an embodiment of the present disclosure. FIGS. 7A, 7B, and 8 are portions corresponding to AA indicated in FIG. 5, respectively.

Referring to FIGS. 7A and 7B, in an embodiment, the liquid crystal member LM may include sequentially stacked first liquid crystal electrodes LC-CL1, liquid crystal layers LCL, and second liquid crystal electrodes LC-CL2. Different voltages may be applied to the first liquid crystal electrode LC-CL1 and the second liquid crystal electrode LC-CL2 to adjust the alignment of the liquid crystal molecules LC included in the liquid crystal layer LCL. An electric field is applied to the liquid crystal molecules LC according to a voltage difference between the first liquid crystal electrode LC-CL1 and the second liquid crystal electrode LC-CL2, and the liquid crystal molecules LC may be regularly arranged. As the liquid crystal molecules LC are regularly arranged, a transmission amount of light incident on the liquid crystal member LM may be adjusted. The arrangement of the liquid crystal molecules LC may be adjusted according to the magnitude of an electric field applied to the liquid crystal molecules LC. For example, by adjusting the voltage of the first liquid crystal electrode LC-CL1 and the second liquid crystal electrode LC-CL2, the arrangement of the liquid crystal molecules LC is adjusted, so that transmission amount of light incident on the liquid crystal member LM may be adjusted.

The liquid crystal layer LCL may include liquid crystal molecules LC. The liquid crystal molecules LC may be nematic liquid crystal (NLC). For example, the liquid crystal molecules LC may include at least one of cyanobiphenyl or cyanotriphenyl. However, this is only an example, and the embodiment is not limited thereto. For example, the liquid crystal molecules may be cholesteric liquid crystal (CLC), and may have a spiral form in which a small amount of chiral dopant is added to nematic liquid crystal (NLC). For example, the liquid crystal molecules may include a cholesteric liquid crystal dopant introduced with carboxylic acid. The liquid crystal molecules LC may be divided into a major axis direction and a minor axis direction. The liquid crystal molecules LC may have a longer axis in a major axis direction than in a minor axis direction. For example, the liquid crystal molecules LC may have an elliptical shape in which a major axis direction is longer than a minor axis direction. When the cholesteric liquid crystal arrangement has a planar structure, it has the property of selectively reflecting light of a specific wavelength, and the circularly polarized light in substantially the same direction as the spiral structure of the CLC may be reflected and the circularly polarized light in the opposite direction may be transmitted.

The liquid crystal layer LCL according to an embodiment may further include a dispersion medium DSM in which the liquid crystal molecules LC are dispersed. The dispersion medium DSM may be a polymer. For example, the dispersion medium DSM may be an acrylate-based polymer. For example, the dispersion medium DSM may include 2-hydroxyethyl acrylate and ethylene glycol phenyl ether acrylate. However, this is only an example, and the embodiment is not limited thereto, and any one capable of dispersing the liquid crystal molecules LC may be used without limitation.

When there is no voltage difference between the first liquid crystal electrode LC-CL1 and the second liquid crystal electrode LC-CL2, the liquid crystal member LM may operate in a first mode in which the liquid crystal molecules LC are irregularly arranged, and when there is a voltage difference between the first liquid crystal electrode LC-CL1 and the second liquid crystal electrode LC-CL2, the liquid crystal member LM may operate in a second mode in which the liquid crystal molecules LC are regularly arranged. The liquid crystal member LM may have a greater light transmittance with respect to light in a specific wavelength region in the second mode than in the first mode. For example, the liquid crystal member LM may have a high light transmittance with respect to light in substantially the same wavelength region as that of the light sensed by the light receiving element OPD. For example, the liquid crystal member LM may have a high transmittance for light having a wavelength of about 750 nm or more and about 2500 nm or less, or may have a high transmittance for light having a wavelength of about 500 nm or more and about 600 nm or less.

Referring to FIG. 7A, in the liquid crystal member LM, liquid crystal molecules LC included in the liquid crystal layer LCL may be irregularly arranged in the first mode. Referring to FIG. 7B, in the liquid crystal member LM in an embodiment, liquid crystal molecules LC included in the liquid crystal layer LCL may be regularly arranged in the second mode. For example, in the liquid crystal member LM, a major axis direction of each of the liquid crystal molecules LC in the second mode may be substantially parallel to a third direction DR3 in which the first liquid crystal electrode LC-CL1 and the second liquid crystal electrode LC-CL2 are stacked. However, this is only an example, and the embodiment is not limited thereto.

For example, referring to FIG. 8, in the liquid crystal member LM-1 according to an embodiment, unlike that shown in FIG. 7B, in the second mode, a major axis direction of each of the liquid crystal molecules LC may be substantially perpendicular to a third direction DR3 in which the first liquid crystal electrode LC-CL1 and the second liquid crystal electrode LC-CL2 are stacked.

In an embodiment, a portion of the first light L1 incident from the outside in the direction of the liquid crystal member LM may be partially transmitted and partially reflected in the liquid crystal layer LCL. For example, the liquid crystal layer LCL may have an increased transmittance of light incident to the liquid crystal layer LCL in the second mode. A portion of the first light L1 may pass through the liquid crystal layer LCL and be incident on the light receiving element OPD. The second light L2 may be the first light L1 transmitted through the liquid crystal layer LCL. The second light L2 may correspond to a light having a specific wavelength region transmitted through the liquid crystal layer LCL among the first light L1. For example, the second light L2 may be light having a wavelength range of about 750 nm or more and about 2500 nm or less, or light having a wavelength range of about 500 nm or more and about 600 nm or less. The electronic device ED according to an embodiment includes the liquid crystal member LM, so that only light of a specific wavelength region is incident on the light receiving element OPD. For example, the liquid crystal member LM may function as a polarization layer. Accordingly, the sensing sensitivity of the light receiving element OPD may be improved.

Also, the first light L1 may be refracted while passing through the liquid crystal layer LCL, so that the light path may be modified. In relation to the first light L1 incident from the outside in the direction of the liquid crystal member LM, according to the incident angle, a portion of the first light L1 may be incident on the light receiving element OPD, and another portion of the first light L1 may not be incident on the light receiving element OPD. The electronic device ED according to an embodiment includes the liquid crystal layer LCL that refracts light, thereby increasing the amount of light incident on the light receiving element OPD. For example, as shown in FIG. 7B, the first light L1 may be incident on the liquid crystal member LM so that the refracted second light L2 may be incident on the light receiving element OPD. Accordingly, the amount of light incident on the light receiving element OPD is increased, so that the sensing sensitivity of the light receiving element OPD may be improved.

In some embodiments, the optical path of the first light L1 and the optical path of the second light L2 in which the first light L1 is refracted and progressed as shown in FIG. 7B are merely examples, and the embodiment is not limited thereto. As long as the second light L2 is refracted and is incident on the light receiving element OPD, the optical paths of the first light L1 and the second light L2 are not limited thereto.

Hereinafter, an electronic device according to an embodiment will be described in more detail with reference to FIGS. 9 and 13. The same contents as those described with reference to FIGS. 1 to 7 will not be described again, but the differences are mainly explained.

Figure 9:
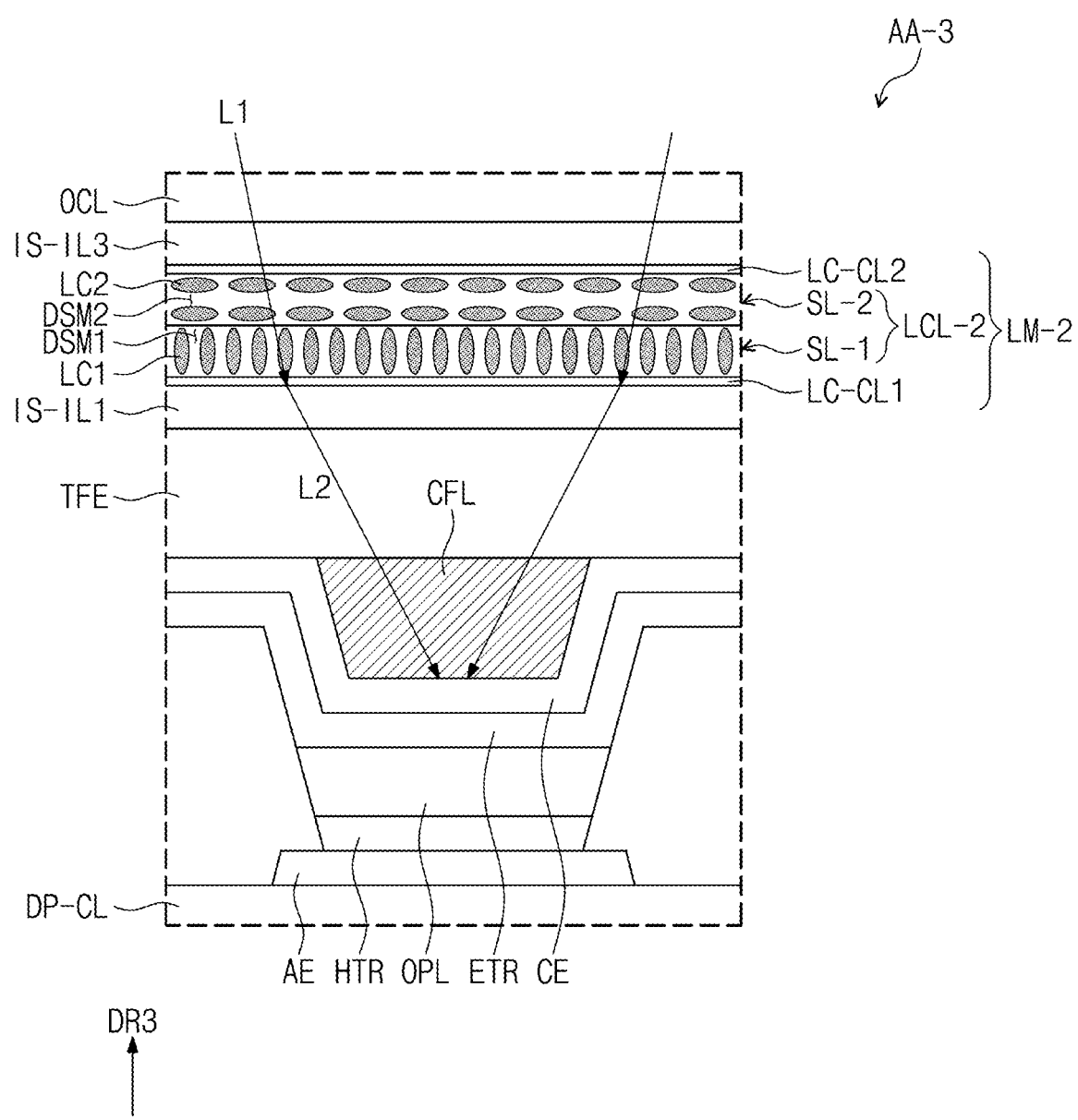
FIG. 9 is a cross-sectional view of a portion of an electronic device according to an embodiment of the present disclosure.
Figure 10:
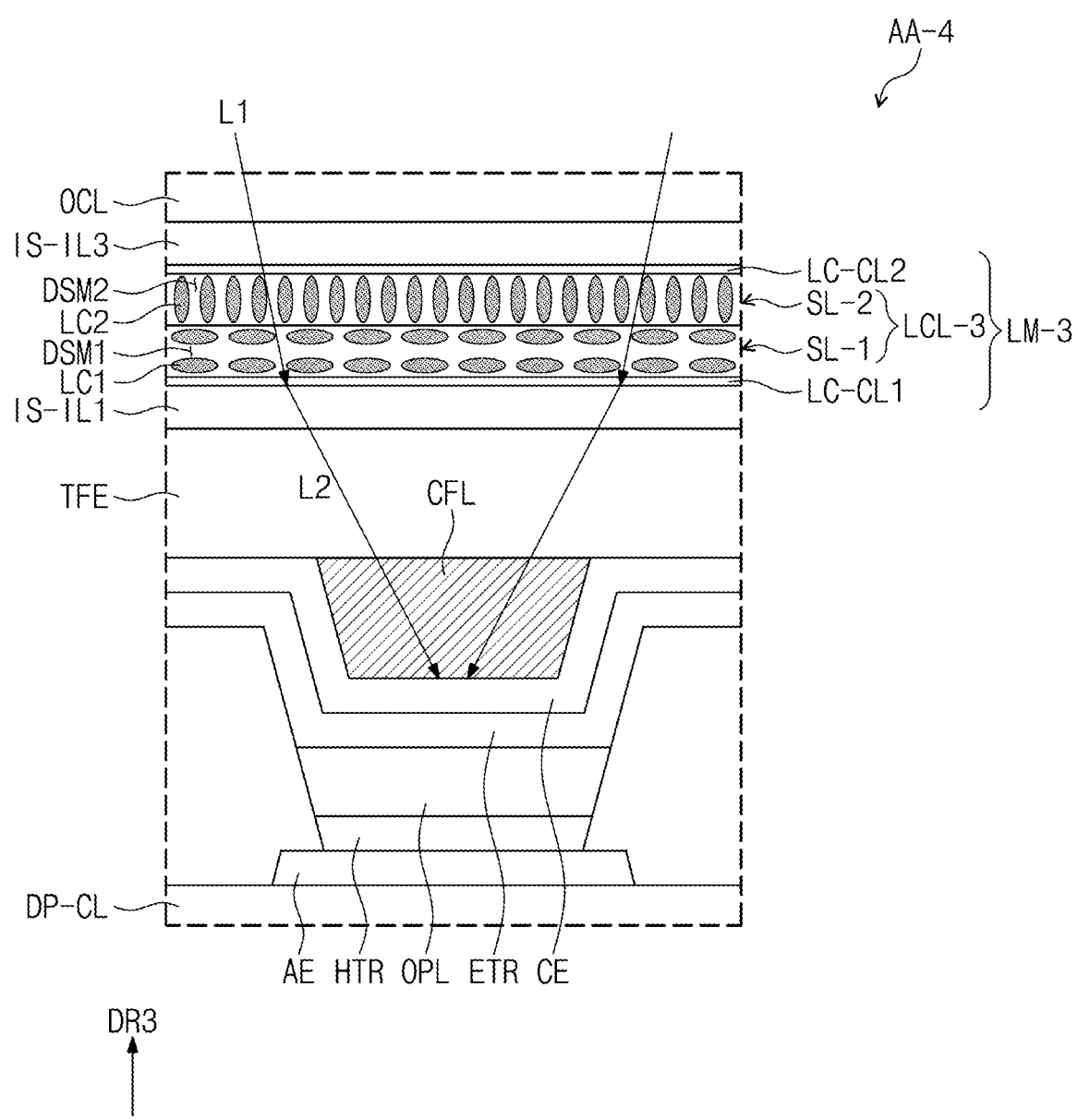
FIG. 10 is a cross-sectional view of a portion of an electronic device according to an embodiment of the present disclosure.

FIGS. 9 and 10 are cross-sectional views each showing a part of a display module according to an embodiment. FIG. 10 is a cross-sectional view of a portion of an electronic device according to an embodiment. FIGS. 9 and 10 are parts corresponding to AA shown in FIG. 5, respectively.

Unlike the liquid crystal member shown in FIGS. 1 to 7, in the liquid crystal members LM-2 and LM-3 shown in FIGS. 9 and 10, there is a difference in that the liquid crystal layers LCL-2 and LCL-3 include two sub liquid crystal layers SL-1 and SL-2.

Referring to FIG. 9, the liquid crystal layer LCL-2 may include a first sub liquid crystal layer SL-1 and a second sub liquid crystal layer SL-2. The first sub liquid crystal layer SL-1 may be disposed on the first liquid crystal electrode LC-CL1. The first sub liquid crystal layer SL-1 may include liquid crystal molecules LC1.

The second sub liquid crystal layer SL-2 may be disposed between the first sub liquid crystal layer SL-1 and the second liquid crystal electrode LC-CL2. The second sub liquid crystal layer SL-2 may include liquid crystal molecules LC2.

When there is no voltage difference between the first liquid crystal electrode LC-CL1 and the second liquid crystal electrode LC-CL2, the first sub liquid crystal layer SL-1 and the second sub liquid crystal layer SL-2 may each operate in a first sub mode in which the liquid crystal molecules LC1 and LC2 are irregularly arranged, and when there is a voltage difference between the first liquid crystal electrode LC-CL1 and the second liquid crystal electrode LC-CL2, the first sub liquid crystal layer SL-1 and the second sub liquid crystal layer SL-2 may each operate in a second sub mode in which the liquid crystal molecules LC1 and LC2 are regularly arranged. The alignment direction of the liquid crystal molecules LC1 included in the first sub liquid crystal layer SL-1 in the second sub mode and the alignment directions of the liquid crystal molecules LC2 included in the second sub liquid crystal layer SL-2 in the second sub mode may be different from each other.

As shown in FIG. 9, in the second sub mode, the major axis direction of the liquid crystal molecules LC1 included in the first sub liquid crystal layer SL-1 may be substantially parallel to the direction in which the first liquid crystal electrode LC-CL1 and the second liquid crystal electrode LC-CL2 are stacked, and in the second sub mode, the major axis direction of the liquid crystal molecules LC2 included in the second sub liquid crystal layer SL-2 may be substantially perpendicular to a direction in which the first liquid crystal electrode LC-CL1 and the second liquid crystal electrode LC-CL2 are stacked. However, this is only an example, and the embodiment is not limited thereto. For example, as shown in FIG. 10, in the second sub mode, the major axis direction of the liquid crystal molecules LC1 included in the first sub liquid crystal layer SL-1 may be substantially perpendicular to the direction in which the first liquid crystal electrode LC-CL1 and the second liquid crystal electrode LC-CL2 are stacked, and in the second sub mode, the major axis direction of the liquid crystal molecules LC2 included in the second sub liquid crystal layer SL-2 may be substantially parallel to a direction in which the first liquid crystal electrode LC-CL1 and the second liquid crystal electrode LC-CL2 are stacked.

In an embodiment, the first light L1 incident from the outside in the direction of the liquid crystal members LM-2 and LM-3 may be partially transmitted and partially reflected in the liquid crystal layers LCL-2 and LCL-3. A portion of the first light L1 may pass through the liquid crystal layers LCL-2 and LCL-3 and may be incident on the light receiving element OPD. For example, the liquid crystal layers LCL-2 and LCL-3 may increase transmittance of light incident to the liquid crystal layers LCL-2 and LCL-3 in the second mode. The second light L2 may be the light from which the first light L1 has passed through the liquid crystal layers LCL-2 and LCL-3. The second light L2 may correspond to a light having a specific wavelength region transmitted through the liquid crystal layers LCL-2 and LCL-3 among the first light L1. For example, the second light L2 may be light having a wavelength range of about 750 nm or more and about 2500 nm or less. The electronic device ED according to an embodiment includes the liquid crystal members LM-2 and LM-3, so that only light of a specific wavelength region is incident on the light receiving element OPD. For example, the liquid crystal members LM-2 and LM-3 may function as a polarization layer. Accordingly, the sensing sensitivity of the light receiving element OPD may be improved.

The first light L1 may be refracted while passing through the liquid crystal layers LCL-2 and LCL-3, so that a light path may be modified. In relation to the first light L1 incident from the outside in the direction of the liquid crystal members LM-2 and LM-3, according to the incident angle, a portion of the first light L1 may be incident on the light receiving element OPD, and another portion of the first light L1 may not be incident on the light receiving element OPD. The electronic device ED according to an embodiment includes the liquid crystal layers LCL-2 and LCL-3 that refract light, thereby increasing the amount of light incident on the light receiving element OPD. For example, as shown in FIGS. 9 and 10, respectively, the first light L1 may be incident on the liquid crystal members LM-2 and LM-3 and the refracted second light L2 may be incident on the light receiving element OPD. Accordingly, the amount of light incident on the light receiving element OPD is increased, so that the sensing sensitivity of the light receiving element OPD may be improved. The electronic device of an embodiment includes a first sub liquid crystal layer SL-1 and a second sub liquid crystal layer SL-2 including different types (kinds) of liquid crystal molecules, so that it is possible to increase the amount of light of a specific wavelength of light incident on the light receiving element OPD, and thus it is possible to improve the sensing sensitivity of the light receiving element OPD.

Figure 11:
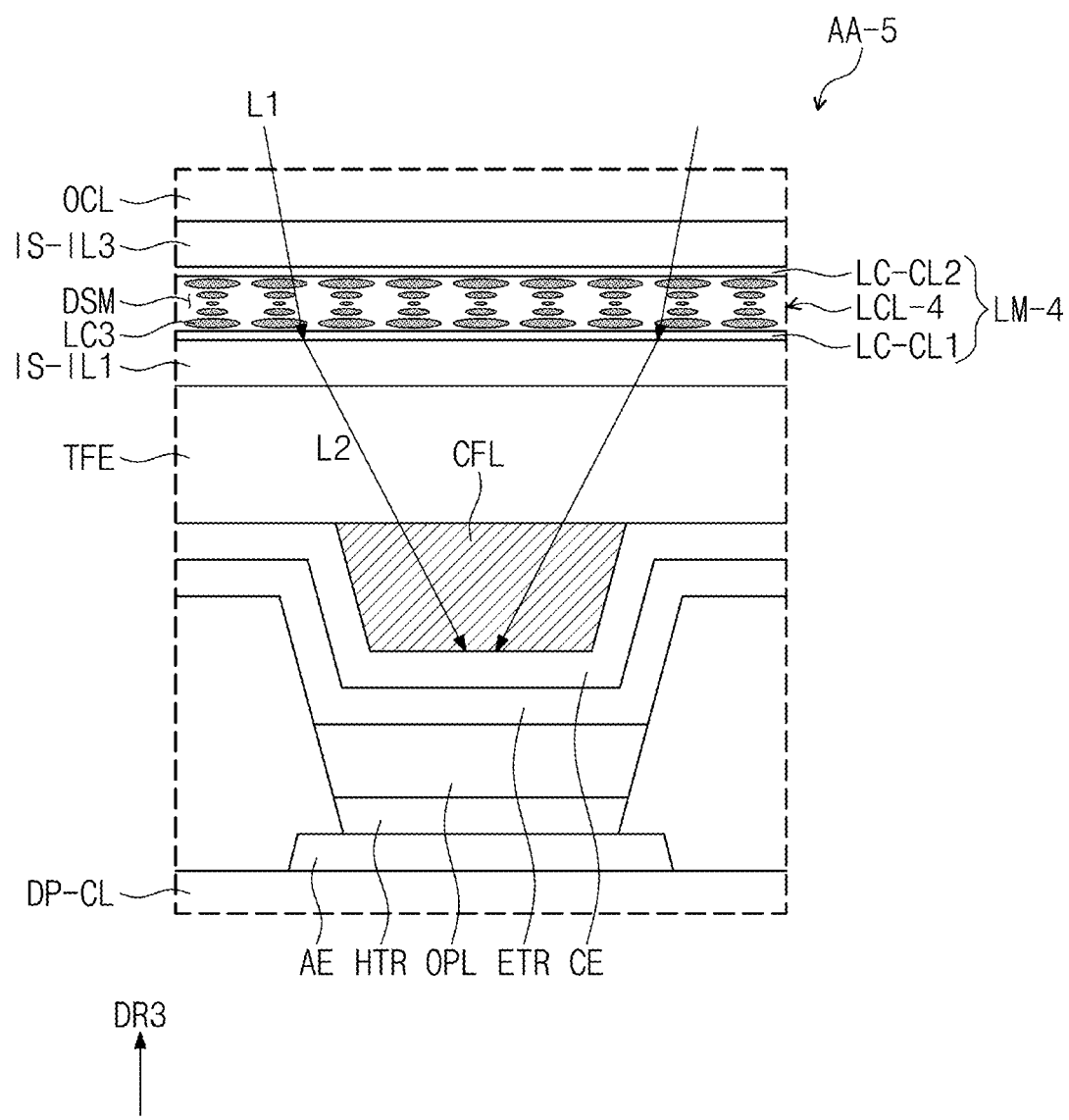
FIG. 11 is a cross-sectional view of a portion of an electronic device according to an embodiment of the present disclosure.
Figure 12:
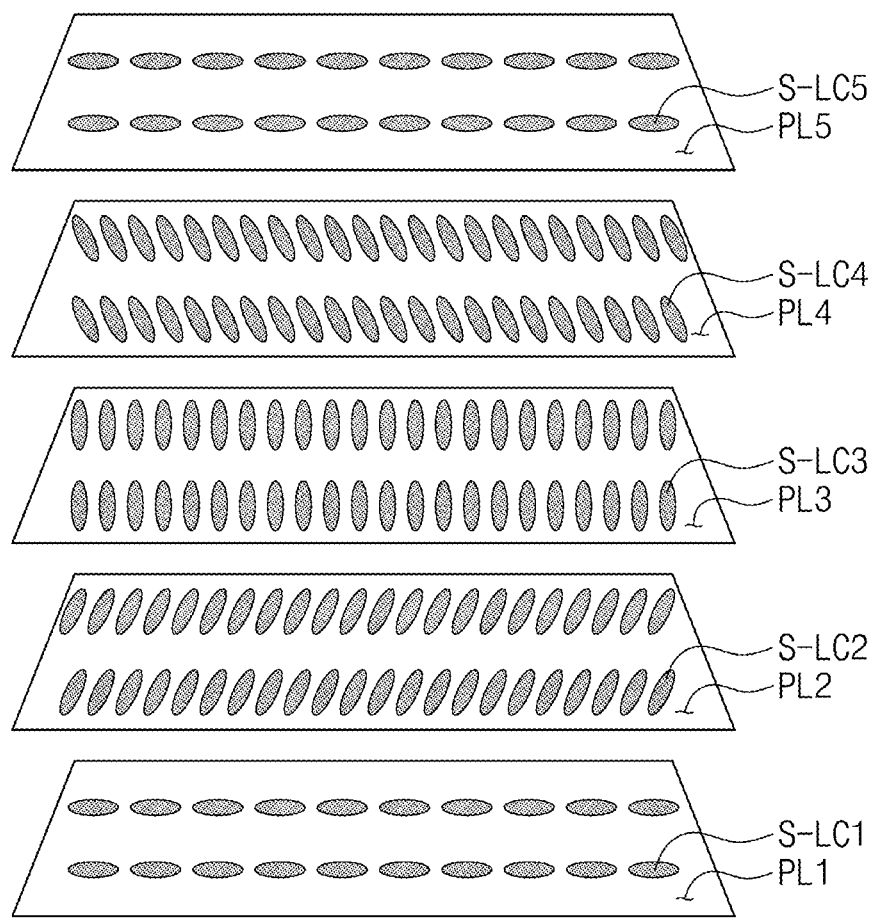
FIG. 12 is a cross-sectional view of a portion of an electronic device according to an embodiment of the present disclosure.

FIG. 11 is a cross-sectional view illustrating a part of a display module according to an embodiment. FIG. 12 is a cross-sectional view illustrating a part of a display module according to an embodiment. FIG. 11 is a portion corresponding to AA shown in FIG. 5. FIG. 12 is an enlarged view of the liquid crystal layer of FIG. 11.

Unlike the liquid crystal layer included in the liquid crystal member shown in FIGS. 1 to 7, the liquid crystal layer included in the liquid crystal member shown in FIGS. 11 and 12 is different in that liquid crystal molecules are cholesteric liquid crystals.

Referring to FIGS. 11 and 12, the liquid crystal molecules LC3 included in the liquid crystal member LM-4 according to an embodiment may be cholesteric liquid crystals. The liquid crystal layer LCL-4 included in the liquid crystal member LM-4 includes liquid crystal molecules LC3, and the liquid crystal molecules LC3 are different in that they are cholesteric liquid crystals.

The liquid crystal layer LCL-4 may have a structure in which liquid crystal molecules LC3 are disposed on each of the first to fifth planes PL1 to PL5 that are substantially parallel to each other. The first sub liquid crystal molecules S-LC1 may be disposed on the first plane PL1. The second sub liquid crystal molecules S-LC2 may be disposed on the second plane PL2. The third sub liquid crystal molecules S-LC3 may be disposed on the third plane PL3. The fourth sub liquid crystal molecules S-LC4 may be disposed on the fourth plane PL4. The fifth sub liquid crystal molecules S-LC5 may be disposed on the fifth plane PL5.

In the second mode, major axis directions of the first to fourth sub liquid crystal molecules S-LC1 to S-LC4 may be aligned in different directions. The major axis direction of the first sub liquid crystal molecules S-LC1 may be oriented in the X direction DR-X, the major axis direction of the second sub liquid crystal molecules S-LC2 may be oriented in the V direction DR-V, the major axis direction of the third sub liquid crystal molecules S-LC3 may be oriented in the Y direction DR-Y, and the major axis direction of the fourth sub liquid crystal molecules L-LC4 may be oriented in the Z direction DR-Z. In some embodiments, the first sub liquid crystal molecules S-LC1 and the fifth sub liquid crystal molecules S-LC5 may be aligned in substantially the same direction. A major axis direction of the fifth sub liquid crystal molecules S-LC5 may be aligned in the X direction DR-X. For example, the first to fifth sub liquid crystal molecules S-LC1 to S-LC5 may sequentially rotate counterclockwise. However, this is only an example, and the embodiment is not limited thereto. For example, the first to fifth sub liquid crystal molecules S-LC1 to S-LC5 may sequentially rotate in a clockwise direction.

In an embodiment, the first light L1 incident from the outside in the direction of the liquid crystal members LM-4 and LM-5 may be partially transmitted and partially reflected in the liquid crystal layers LCL-4 and LCL-5. A portion of the first light L1 may pass through the liquid crystal layers LCL-4 and LCL-5 and be incident on the light receiving element OPD. For example, the liquid crystal layers LCL-4 and LCL-5 may increase transmittance of light incident to the liquid crystal layers LCL-4 and LCL-5 in the second mode. The second light L2 may be the light from which the first light L1 has passed through the liquid crystal layers LCL-4 and LCL-5. The second light L2 may correspond to a light having a specific wavelength region transmitted through the liquid crystal layers LCL-4 and LCL-5 among the first light L1. For example, the second light L2 may be light having a wavelength range of about 750 nm or more and about 2500 nm or less. However, this is only an example, and the embodiment is not limited thereto. For example, the second light L2 may be light having a wavelength range of about 500 nm or more and about 600 nm or less. The electronic device ED according to an embodiment includes the liquid crystal members LM-4 and LM-5, so that only light of a specific wavelength region is incident on the light receiving element OPD. For example, the liquid crystal members LM-4 and LM-5 may function as a polarization layer. Accordingly, the sensing sensitivity of the light receiving element OPD may be improved.

The first light L1 may be refracted while passing through the liquid crystal layers LCL-4 and LCL-5, so that a light path may be modified. In relation to the first light L1 incident from the outside in the direction of the liquid crystal member LM-2, according to the incident angle, a portion of the first light L1 may be incident on the light receiving element OPD, and another portion of the first light L1 may not be incident on the light receiving element OPD. The electronic device ED according to an embodiment includes the liquid crystal layers LCL-4 and LCL-5 that refract light, thereby increasing the amount of light incident on the light receiving element OPD. For example, as shown in FIGS. 11 and 12, respectively, the first light L1 may be incident on the liquid crystal members LM-4 and LM-5 and the refracted second light L2 may be incident on the light receiving element OPD. Accordingly, the amount of light incident on the light receiving element (OPD) is increased, so that the sensing sensitivity of the light receiving element (OPD) may be improved. The electronic device of an embodiment includes liquid crystal members LM-4 and LM-5 including liquid crystal layers LCL-4 and LCL-5 including cholesteric liquid crystal, so that it is possible to increase the amount of light incident on the light receiving element OPD, thereby improving the sensing sensitivity of the light receiving element OPD.

Figure 13:
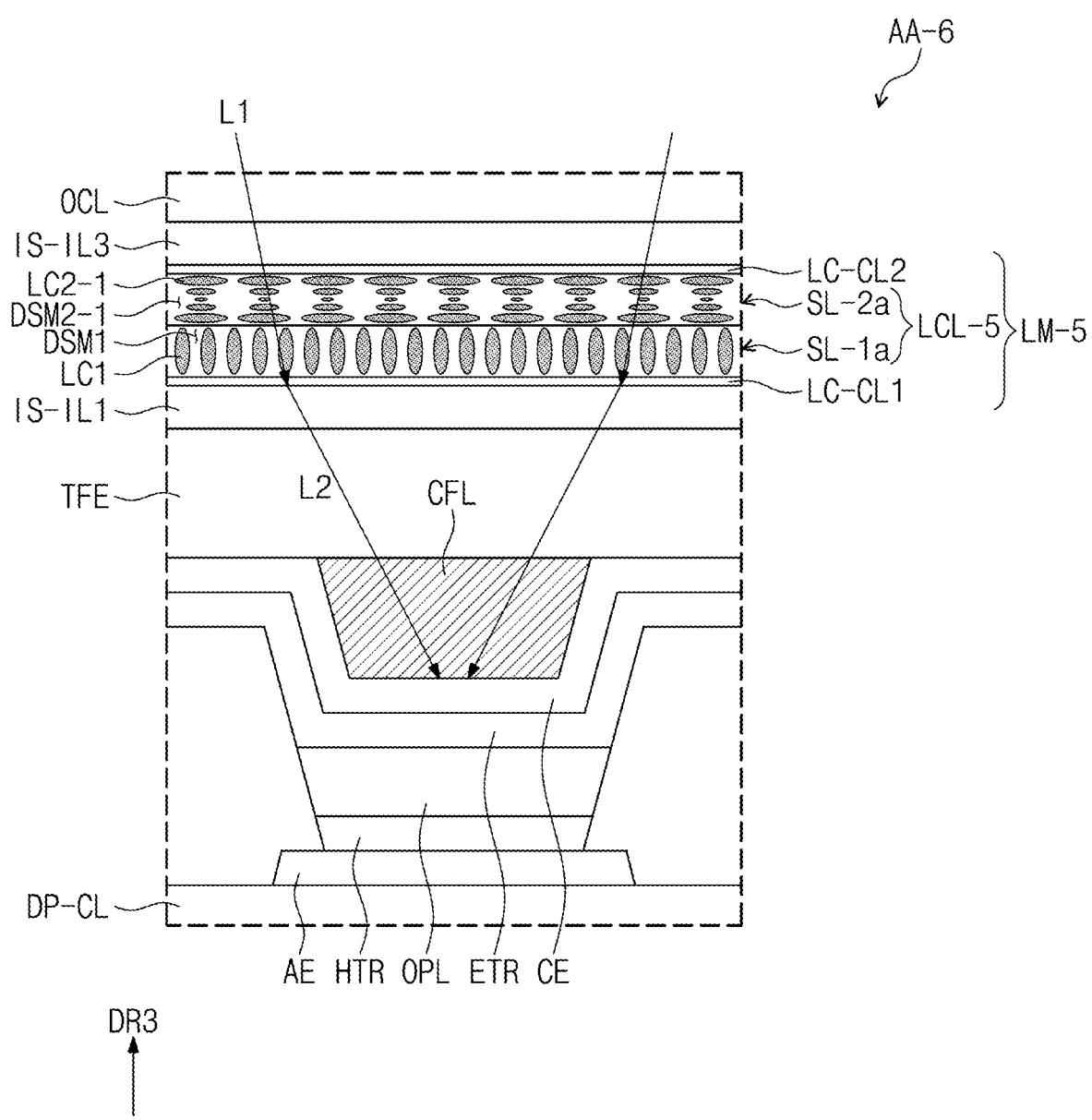
FIG. 13 is a cross-sectional view of a portion of an electronic device according to an embodiment of the present disclosure.
Figure 14:
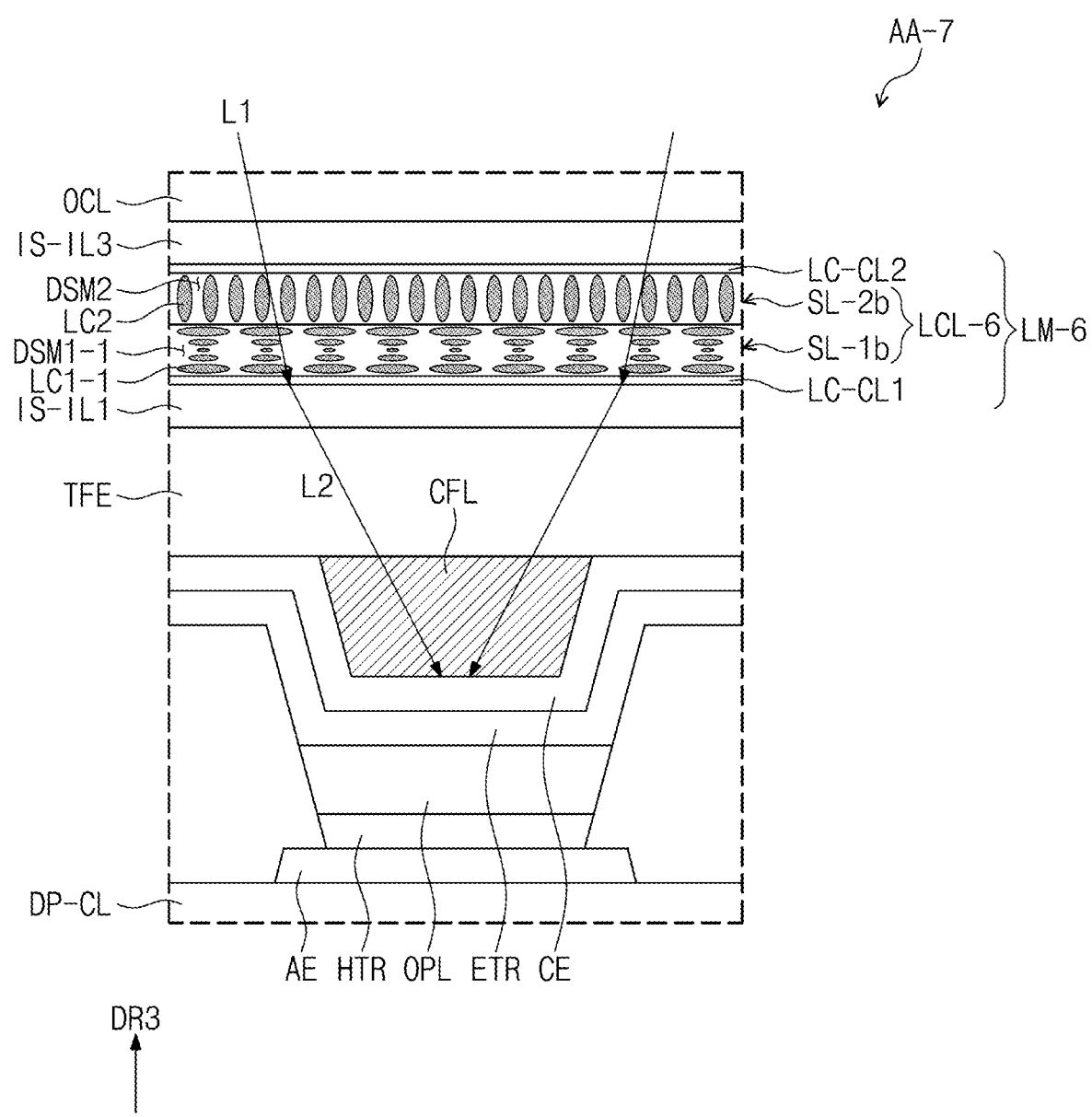
FIG. 14 is a cross-sectional view of a portion of an electronic device according to an embodiment of the present disclosure.

FIG. 13 is a cross-sectional view of a portion of an electronic device according to an embodiment of the present disclosure. FIG. 14 is a cross-sectional view of a portion of an electronic device according to an embodiment of the present disclosure. FIG. 13 is a portion corresponding to AA shown in FIG. 5. FIG. 14 is a portion corresponding to AA shown in FIG. 5.

Unlike the liquid crystal layer included in the liquid crystal member shown in FIG. 9, the liquid crystal layer included in the liquid crystal member shown in FIGS. 13 and 14 differs in that cholesteric liquid crystal molecules are included in any one of the two sub-liquid crystal layers.

Referring to FIGS. 13 and 14, the first sub liquid crystal layers SL-la and SL-1b and the second sub liquid crystal layers SL-2a and SL-2b may include different types (kinds) of liquid crystal molecules. As shown in FIG. 13, the liquid crystal molecules LC1 included in the first sub liquid crystal layer SL-la may be nematic liquid crystals, and the liquid crystal molecules LC2-1 included in the second sub liquid crystal layer SL-2a may be cholesteric liquid crystals. As shown in FIG. 14, the liquid crystal molecules LC1-1 included in the first sub liquid crystal layer SL-1b may be cholesteric liquid crystals, and the liquid crystal molecules LC2 included in the second sub liquid crystal layer SL-2b may be nematic liquid crystals. In the electronic device of one embodiment, by the liquid crystal members LM-5 and LM-6 including the first sub liquid crystal layers SL-1a and SL-1b and the second sub liquid crystal layers SL-2a and SL-2b including different types (kinds) of liquid crystal molecules, it is possible to increase the amount of light incident on the light receiving element OPD, thereby improving the sensing sensitivity of the light receiving element OPD.

An electronic device according to an embodiment includes a liquid crystal member disposed on a display element layer to overlap a light receiving element. When the liquid crystal member does not have a voltage difference between the first liquid crystal electrode and the second liquid crystal electrode, the liquid crystal member may operate in the first mode, and when an electric field is applied to the liquid crystal molecules due to a voltage difference between the first liquid crystal electrode and the second liquid crystal electrode, the liquid crystal member may operate in the second mode. When the liquid crystal member operates in the second mode, light transmittance with respect to the light incident on the liquid crystal member may be increased compared to when the liquid crystal member operates in the first mode. In some embodiments, the liquid crystal member may refract light so that light not directed to the light receiving element may be incident on the light receiving element. Accordingly, in the electronic device of the present disclosure, the light receiving element may have excellent or suitable sensing sensitivity.

One embodiment includes a liquid crystal member disposed overlapping a light receiving element on a display element layer, so that the light receiving element may provide an electronic device with improved sensing characteristics.

As used herein "at least one of a, b or c", "at least one selected from a, b and c", etc., may indicate only a, only b, only c, both (e.g., simultaneously) a and b, both (e.g., simultaneously) a and c, both (e.g., simultaneously) b and c, all of a, b, and c, or variations thereof. Further, the use of "may" when describing embodiments of the present invention refers to "one or more embodiments of the present invention."

As used herein, the term "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The electronic device and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

Although the embodiments of the present disclosure have been described, it is understood that the present disclosure should not be limited to these embodiments but one or more suitable changes and modifications may be made by one ordinary skilled in the art within the spirit and scope of the present disclosure as hereinafter claimed and equivalents thereof.

What is claimed is:

1. An electronic device comprising:
a base layer;
a circuit layer on the base layer;

a display element layer on the circuit layer, the display element layer comprising a pixel defining film having an opening part, and a light emitting element and a light receiving element divided by the pixel defining film;

an input detection layer on the display element layer and overlapping the light emitting element; and a liquid crystal member on the display element layer and overlapping the light receiving element, wherein the liquid crystal member comprises:

a first liquid crystal electrode;

a second liquid crystal electrode on the first liquid crystal electrode; and a liquid crystal layer between the first liquid crystal electrode and the second liquid crystal electrode, and comprising a plurality of liquid crystal molecules.

2. The electronic device of claim 1, wherein when there is no voltage difference between the first liquid crystal electrode and the second liquid crystal electrode, the liquid crystal member operates in a first mode in which the liquid crystal molecules are irregularly arranged; and when there is a voltage difference between the first liquid crystal electrode and the second liquid crystal electrode, the liquid crystal member operates in a second mode in which the liquid crystal molecules are regularly arranged.

3. The electronic device of claim 2, wherein in the second mode, a major axis direction of the liquid crystal molecules is substantially parallel to a stacking direction of the first liquid crystal electrode and the second liquid crystal electrode.

4. The electronic device of claim 2, wherein in the second mode, a major axis direction of the liquid crystal molecules is substantially perpendicular to a direction in which the first liquid crystal electrode and the second liquid crystal electrode are stacked.

5. The electronic device of claim 2, wherein the liquid crystal molecules comprise first to fifth sub liquid crystal molecules respectively on first to fifth planes substantially parallel to each other, wherein in the second mode, the first to fourth sub liquid crystal molecules are each independently aligned in different directions, and the fifth sub liquid crystal molecules are each independently aligned in a same direction as the first sub liquid crystal molecules.

6. The electronic device of claim 1, wherein the liquid crystal layer further comprises a dispersion medium in which the liquid crystal molecules are dispersed, wherein the dispersion medium comprises a polymer.

7. The electronic device of claim 1, wherein the liquid crystal layer comprises:

a first sub liquid crystal layer on the first liquid crystal electrode and comprising the liquid crystal molecules; and a second sub liquid crystal layer between the first sub liquid crystal layer and the second liquid crystal electrode and comprising the liquid crystal molecules, wherein when there is no voltage difference between the first liquid crystal electrode and the second liquid crystal electrode, each of the first sub liquid crystal layer and the second sub liquid crystal layer operates in a first sub mode in which the liquid crystal molecules are irregularly arranged, and when there is a voltage difference between the first liquid crystal electrode and the second liquid crystal electrode, each of the first sub liquid crystal layer and the second sub liquid crystal layer operates in a second sub mode in which the liquid crystal molecules are regularly arranged, wherein an alignment direction of the liquid crystal molecules included in the first sub liquid crystal layer in the second sub mode and an alignment direction of the liquid crystal molecules included in the second sub liquid crystal layer in the second sub mode are different from each other.

8. The electronic device of claim 7, wherein in the second sub mode, a major axis direction of the liquid crystal molecules included in the first sub liquid crystal layer is substantially parallel to a direction in which the first liquid crystal electrode and the second liquid crystal electrode are stacked, wherein in the second sub mode, a major axis direction of the liquid crystal molecules included in the second sub liquid crystal layer is substantially perpendicular to a direction in which the first liquid crystal electrode and the second liquid crystal electrode are stacked.

9. The electronic device of claim 7, wherein in the second sub mode, a major axis direction of the liquid crystal molecules included in the first sub liquid crystal layer is substantially perpendicular to a direction in which the first liquid crystal electrode and the second liquid crystal electrode are stacked, wherein in the second sub mode, a major axis direction of the liquid crystal molecules included in the second sub liquid crystal layer is substantially parallel to a direction in which the first liquid crystal electrode and the second liquid crystal electrode are stacked.

10. The electronic device of claim 1, wherein no polarization layer is included on the input detection layer.

11. The electronic device of claim 1, further comprising a color filter layer between the light receiving element and the input detection layer.

12. The electronic device of claim 11, wherein the color filter layer is to transmit light in a wavelength region of about 750 nm or more and about 2500 nm or less or light in a wavelength region of about 500 nm or more and about 600 nm or less, wherein the light receiving element is to detect light in a wavelength region of about 750 nm or more and about 2500 nm or less or light in a wavelength region of about 500 nm or more and about 600 nm or less.

13. An electronic device divided into first to third light emitting areas, a non-light emitting area, and a light receiving area, the electronic device comprising:

a base layer;

a circuit layer on the base layer;

a first electrode on the circuit layer to correspond to the first to third light emitting areas and the light receiving area;

a hole transport region on the first electrode and corresponding to the first to third light emitting areas, the non-light emitting area, and the light receiving area;

a first light emitting layer on the hole transport region corresponding to the first light emitting area and to emit a first light;

a second light emitting layer on the hole transport region corresponding to the second light emitting area and to emit a second light;

a third light emitting layer on the hole transport region corresponding to the third light emitting area and to emit a third light;

a light receiving layer on the hole transport region corresponding to the light receiving area;

an electron transport region on the first to third light emitting layers and the light receiving layer;

a second electrode on the electron transport region;

a first liquid crystal electrode on the second electrode to overlap the light receiving layer;

a second liquid crystal electrode on the first liquid crystal electrode; and a liquid crystal layer between the first liquid crystal electrode and the second liquid crystal electrode, the liquid crystal layer comprising a dispersion medium and a plurality of liquid crystal molecules dispersed in the dispersion medium.

14. The electronic device of claim 13, further comprising a color filter layer between the light receiving layer and the first liquid crystal electrode.

15. The electronic device of claim 14, wherein the color filter layer transmits light in a wavelength region of about 750 nm or more and about 2500 nm or less or light in a wavelength region of about 500 nm or more and about 600 nm or less, wherein the light receiving layer detects light in a wavelength region of about 750 nm or more and about 2500 nm or less or light in a wavelength region of about 500 nm or more and about 600 nm or less.

16. The electronic device of claim 13, wherein when there is no voltage difference between the first liquid crystal electrode and the second liquid crystal electrode, the liquid crystal layer operates in a first mode in which the liquid crystal molecules are irregularly arranged; and when there is a voltage difference between the first liquid crystal electrode and the second liquid crystal electrode, the liquid crystal layer operates in a second mode in which the liquid crystal molecules are regularly arranged.

17. The electronic device of claim 16, wherein in the second mode, a major axis direction of the liquid crystal molecules is parallel to a direction in which the first liquid crystal electrode and the second liquid crystal electrode are stacked, or is perpendicular to a direction in which the first liquid crystal electrode and the second liquid crystal electrode are stacked.

18. The electronic device of claim 13, wherein the liquid crystal layer comprises:

a first sub liquid crystal layer on the first liquid crystal electrode and comprising the liquid crystal molecules; and a second sub liquid crystal layer between the first sub liquid crystal layer and the second liquid crystal electrode and comprising the liquid crystal molecules, wherein the first sub liquid crystal layer and the second sub liquid crystal layer comprise different materials.

19. The electronic device of claim 18, wherein in one of the first sub liquid crystal layer or the second sub liquid crystal layer, the liquid crystal molecules are nematic liquid crystals, and in the other one of the first sub liquid crystal layer or the second sub liquid crystal layer, the liquid crystal molecules are cholesteric liquid crystal.

20. The electronic device of claim 13, further comprising an input detection layer on the second electrode and overlapping the first to third light emitting layers.

* * * * *